United States Patent
Piekniewski et al.

(10) Patent No.: US 9,848,112 B2
(45) Date of Patent: Dec. 19, 2017

(54) OPTICAL DETECTION APPARATUS AND METHODS

(71) Applicant: Brain Corporation, San Diego, CA (US)

(72) Inventors: Filip Piekniewski, San Diego, CA (US); Vadim Polonichko, San Diego, CA (US); Eugene Izhikevich, San Diego, CA (US)

(73) Assignee: Brain Corporation, San Diego, CA (US)

( * ) Notice: Subject to any disclaimer, the term of this patent is extended or adjusted under 35 U.S.C. 154(b) by 521 days.

(21) Appl. No.: 14/321,736

(22) Filed: Jul. 1, 2014

(65) Prior Publication Data

US 2016/0004923 A1    Jan. 7, 2016

(51) Int. Cl.
*H04N 5/225* (2006.01)
*G01C 3/08* (2006.01)
(Continued)

(52) U.S. Cl.
CPC .......... *H04N 5/2258* (2013.01); *B60W 30/09* (2013.01); *B60W 30/14* (2013.01); *B60W 30/16* (2013.01);
(Continued)

(58) Field of Classification Search
CPC ...... B60W 30/08; B60W 30/09; B60W 30/14; B60W 30/16; B60W 30/17; H04N 5/225;
(Continued)

(56) References Cited

U.S. PATENT DOCUMENTS

| 5,063,603 A | 11/1991 | Burt |
| 5,138,447 A | 8/1992 | Shen et al. |

(Continued)

FOREIGN PATENT DOCUMENTS

| CN | 102226740 A | 10/2011 |
| JP | H0487423 A | 3/1992 |

(Continued)

OTHER PUBLICATIONS

Berke, et al., Slow feature analysis yields a rich repertoire of complex cell properties. Journal of Vision (2005) vol. 5 (6).
(Continued)

*Primary Examiner* — Lin Ye
*Assistant Examiner* — Chriss Yoder, III
(74) *Attorney, Agent, or Firm* — Gazdzinski & Associates, PC

(57) ABSTRACT

An optical object detection apparatus and associated methods. The apparatus may comprise a lens (e.g., fixed-focal length wide aperture lens) and an image sensor. The fixed focal length of the lens may correspond to a depth of field area in front of the lens. When an object enters the depth of field area (e.g., due to a relative motion between the object and the lens) the object representation on the image sensor plane may be in-focus. Objects outside the depth of field area may be out of focus. In-focus representations of objects may be characterized by a greater contrast parameter compared to out of focus representations. One or more images provided by the detection apparatus may be analyzed in order to determine useful information (e.g., an image contrast parameter) of a given image. Based on the image contrast meeting one or more criteria, a detection indication may be produced.

20 Claims, 11 Drawing Sheets

(51) Int. Cl.

| | | |
|---|---|---|
| *G02B 7/38* | (2006.01) | |
| *B60W 30/09* | (2012.01) | |
| *B60W 30/14* | (2006.01) | |
| *G06K 9/00* | (2006.01) | |
| *G02B 5/20* | (2006.01) | |
| *G02B 13/00* | (2006.01) | |
| *B60W 30/16* | (2012.01) | |
| *G06K 9/46* | (2006.01) | |
| *G06K 9/52* | (2006.01) | |
| *G02B 27/00* | (2006.01) | |

(52) U.S. Cl.
CPC ............... *G01C 3/08* (2013.01); *G02B 5/204* (2013.01); *G02B 7/38* (2013.01); *G02B 13/0015* (2013.01); *G06K 9/00624* (2013.01); *G06K 9/00664* (2013.01); *G06K 9/00791* (2013.01); *G06K 9/00825* (2013.01); *G06K 9/4614* (2013.01); *G06K 9/522* (2013.01); *H04N 5/2253* (2013.01); *G02B 27/0075* (2013.01)

(58) Field of Classification Search
CPC  H04N 5/2258; G01B 11/026; G01B 11/0691; G01C 3/00–3/32; G02B 3/36; G02B 3/38; G06K 9/00664; G06K 9/00791; G06K 9/00825; G06K 9/6215; G06T 7/0051; G06T 7/50–7/596
See application file for complete search history.

(56) References Cited

U.S. PATENT DOCUMENTS

| | | | |
|---|---|---|---|
| 5,216,752 A | 6/1993 | Tam | |
| 5,272,535 A | 12/1993 | Elabd | |
| 5,355,435 A | 10/1994 | DeYong et al. | |
| 5,638,359 A | 6/1997 | Peltola et al. | |
| 5,673,367 A | 9/1997 | Buckley | |
| 5,875,108 A | 2/1999 | Hoffberg et al. | |
| 6,009,418 A | 12/1999 | Cooper | |
| 6,014,653 A | 1/2000 | Thaler | |
| 6,035,389 A | 3/2000 | Grochowski et al. | |
| 6,418,424 B1 | 7/2002 | Hoffberg et al. | |
| 6,458,157 B1 | 10/2002 | Suaning | |
| 6,501,794 B1 | 12/2002 | Wang et al. | |
| 6,509,854 B1 | 1/2003 | Morita et al. | |
| 6,545,705 B1 | 4/2003 | Sigel et al. | |
| 6,545,708 B1 | 4/2003 | Tamayama et al. | |
| 6,546,291 B2 | 4/2003 | Merfeld et al. | |
| 6,556,610 B1 | 4/2003 | Jiang et al. | |
| 6,581,046 B1 | 6/2003 | Ahissar | |
| 6,625,317 B1 | 9/2003 | Gaffin et al. | |
| 6,678,590 B1 | 1/2004 | Burchfiel | |
| 7,016,783 B2* | 3/2006 | Hac ................... | B60K 31/0008 180/167 |
| 7,113,867 B1* | 9/2006 | Stein ................. | G06K 9/00805 701/301 |
| 7,142,602 B2 | 11/2006 | Porikli et al. | |
| 7,430,682 B2 | 9/2008 | Carlson et al. | |
| 7,447,337 B2 | 11/2008 | Zhang et al. | |
| 7,580,907 B1 | 8/2009 | Rhodes | |
| 7,653,255 B2 | 1/2010 | Rastogi | |
| 7,737,933 B2 | 6/2010 | Yamano et al. | |
| 7,849,030 B2 | 12/2010 | Ellingsworth | |
| 8,000,967 B2 | 8/2011 | Taleb | |
| 8,015,130 B2 | 9/2011 | Matsugu et al. | |
| 8,103,602 B2 | 1/2012 | Izhikevich | |
| 8,108,147 B1* | 1/2012 | Blackburn ............ | G08G 1/166 235/454 |
| 8,160,354 B2 | 4/2012 | Paquier | |
| 8,200,593 B2 | 6/2012 | Guillen et al. | |
| 8,311,965 B2 | 11/2012 | Breitwisch et al. | |
| 8,315,305 B2 | 11/2012 | Petre et al. | |
| 8,390,707 B2 | 3/2013 | Yamashita | |
| 8,416,847 B2 | 4/2013 | Roman | |
| 8,467,623 B2 | 6/2013 | Izhikevich et al. | |
| 8,542,875 B2* | 9/2013 | Eswara ................ | G06K 9/3233 382/103 |
| 8,712,939 B2 | 4/2014 | Szatmary et al. | |
| 9,150,220 B2* | 10/2015 | Clarke ................. | B60W 30/00 |
| 2002/0038294 A1 | 3/2002 | Matsugu | |
| 2002/0176025 A1 | 11/2002 | Kim et al. | |
| 2003/0050903 A1 | 3/2003 | Liaw et al. | |
| 2003/0216919 A1 | 11/2003 | Roushar | |
| 2004/0054964 A1 | 3/2004 | Bozdagi et al. | |
| 2004/0136439 A1 | 7/2004 | Dewberry et al. | |
| 2004/0170330 A1 | 9/2004 | Fogg et al. | |
| 2004/0193670 A1 | 9/2004 | Langan et al. | |
| 2004/0233987 A1 | 11/2004 | Porikli et al. | |
| 2005/0015351 A1 | 1/2005 | Nugent | |
| 2005/0036649 A1 | 2/2005 | Yokono et al. | |
| 2005/0047647 A1 | 3/2005 | Rutishauser et al. | |
| 2005/0096539 A1 | 5/2005 | Leibig et al. | |
| 2005/0283450 A1 | 12/2005 | Matsugu et al. | |
| 2006/0088191 A1 | 4/2006 | Zhang et al. | |
| 2006/0094001 A1 | 5/2006 | Torre et al. | |
| 2006/0127042 A1 | 6/2006 | Park et al. | |
| 2006/0129728 A1 | 6/2006 | Hampel | |
| 2006/0161218 A1 | 7/2006 | Danilov | |
| 2006/0188168 A1* | 8/2006 | Sheraizin ............. | G06T 5/002 382/254 |
| 2007/0022068 A1 | 1/2007 | Linsker | |
| 2007/0071100 A1 | 3/2007 | Shi et al. | |
| 2007/0176643 A1 | 8/2007 | Nugent | |
| 2007/0208678 A1 | 9/2007 | Matsugu | |
| 2008/0043848 A1 | 2/2008 | Kuhn | |
| 2008/0100482 A1 | 5/2008 | Lazar | |
| 2008/0152236 A1 | 6/2008 | Vendrig et al. | |
| 2008/0174700 A1 | 7/2008 | Takaba | |
| 2008/0199072 A1 | 8/2008 | Kondo et al. | |
| 2008/0205764 A1 | 8/2008 | Iwai et al. | |
| 2008/0237446 A1 | 10/2008 | Oshikubo et al. | |
| 2008/0252723 A1 | 10/2008 | Park | |
| 2008/0267458 A1 | 10/2008 | Laganiere et al. | |
| 2009/0028384 A1 | 1/2009 | Bovyrin et al. | |
| 2009/0043722 A1 | 2/2009 | Nugent | |
| 2009/0096927 A1 | 4/2009 | Camp, Jr. et al. | |
| 2009/0106030 A1 | 4/2009 | Den Brinker et al. | |
| 2009/0141938 A1 | 6/2009 | Lim et al. | |
| 2009/0202114 A1 | 8/2009 | Morin et al. | |
| 2009/0287624 A1 | 11/2009 | Rouat et al. | |
| 2009/0304231 A1 | 12/2009 | Lu et al. | |
| 2009/0312985 A1 | 12/2009 | Eliazar | |
| 2009/0323809 A1 | 12/2009 | Raveendran | |
| 2010/0036457 A1 | 2/2010 | Sarpeshkar et al. | |
| 2010/0073371 A1 | 3/2010 | Ernst et al. | |
| 2010/0080297 A1 | 4/2010 | Wang et al. | |
| 2010/0081958 A1 | 4/2010 | She | |
| 2010/0086171 A1 | 4/2010 | Lapstun | |
| 2010/0100482 A1 | 4/2010 | Hardt | |
| 2010/0166320 A1 | 7/2010 | Paquier | |
| 2010/0225824 A1 | 9/2010 | Lazar et al. | |
| 2010/0235310 A1 | 9/2010 | Gage et al. | |
| 2010/0271511 A1 | 10/2010 | Ma et al. | |
| 2010/0290530 A1 | 11/2010 | Huang et al. | |
| 2010/0299296 A1 | 11/2010 | Modha et al. | |
| 2011/0002191 A1 | 1/2011 | Demaio et al. | |
| 2011/0016071 A1 | 1/2011 | Guillen et al. | |
| 2011/0063409 A1 | 3/2011 | Hannuksela | |
| 2011/0103480 A1 | 5/2011 | Dane | |
| 2011/0119214 A1 | 5/2011 | Breitwisch et al. | |
| 2011/0119215 A1 | 5/2011 | Elmegreen et al. | |
| 2011/0134242 A1 | 6/2011 | Loubser et al. | |
| 2011/0137843 A1 | 6/2011 | Poon et al. | |
| 2011/0160741 A1 | 6/2011 | Asano et al. | |
| 2011/0170792 A1 | 7/2011 | Tourapis et al. | |
| 2011/0206122 A1 | 8/2011 | Lu et al. | |
| 2011/0222603 A1 | 9/2011 | Le Barz et al. | |
| 2011/0228092 A1 | 9/2011 | Park | |
| 2011/0242341 A1 | 10/2011 | Agrawal et al. | |
| 2012/0011090 A1 | 1/2012 | Tang et al. | |
| 2012/0057634 A1 | 3/2012 | Shi et al. | |
| 2012/0072189 A1 | 3/2012 | Bullen et al. | |

(56) References Cited

U.S. PATENT DOCUMENTS

| | | | |
|---|---|---|---|
| 2012/0083982 A1 | 4/2012 | Bonefas et al. | |
| 2012/0084240 A1 | 4/2012 | Esser et al. | |
| 2012/0109866 A1 | 5/2012 | Modha | |
| 2012/0130566 A1* | 5/2012 | Anderson | G05D 1/0684 701/16 |
| 2012/0162450 A1 | 6/2012 | Park et al. | |
| 2012/0212579 A1 | 8/2012 | Froejdh et al. | |
| 2012/0236114 A1 | 9/2012 | Chang et al. | |
| 2012/0243733 A1 | 9/2012 | Sawai | |
| 2012/0256941 A1 | 10/2012 | Ballestad et al. | |
| 2012/0294486 A1 | 11/2012 | Diggins et al. | |
| 2012/0303091 A1 | 11/2012 | Izhikevich | |
| 2012/0308076 A1 | 12/2012 | Piekniewski et al. | |
| 2012/0308136 A1 | 12/2012 | Izhikevich | |
| 2012/0330447 A1 | 12/2012 | Gerlach et al. | |
| 2013/0022111 A1 | 1/2013 | Chen et al. | |
| 2013/0050574 A1 | 2/2013 | Lu et al. | |
| 2013/0051680 A1 | 2/2013 | Kono et al. | |
| 2013/0073484 A1 | 3/2013 | Izhikevich et al. | |
| 2013/0073491 A1 | 3/2013 | Izhikevich et al. | |
| 2013/0073492 A1 | 3/2013 | Izhikevich et al. | |
| 2013/0073495 A1 | 3/2013 | Izhikevich et al. | |
| 2013/0073496 A1 | 3/2013 | Szatmary et al. | |
| 2013/0073498 A1 | 3/2013 | Izhikevich et al. | |
| 2013/0073499 A1 | 3/2013 | Izhikevich et al. | |
| 2013/0073500 A1 | 3/2013 | Szatmary et al. | |
| 2013/0148882 A1 | 6/2013 | Lee | |
| 2013/0151450 A1 | 6/2013 | Ponulak | |
| 2013/0176430 A1 | 7/2013 | Zhu et al. | |
| 2013/0218821 A1 | 8/2013 | Szatmary et al. | |
| 2013/0251278 A1 | 9/2013 | Izhikevich et al. | |
| 2013/0297539 A1 | 11/2013 | Piekniewski et al. | |
| 2013/0297541 A1 | 11/2013 | Piekniewski et al. | |
| 2013/0297542 A1 | 11/2013 | Piekniewski et al. | |
| 2013/0325766 A1 | 12/2013 | Petre et al. | |
| 2013/0325768 A1 | 12/2013 | Sinyavskiy et al. | |
| 2013/0325773 A1 | 12/2013 | Sinyavskiy et al. | |
| 2013/0325774 A1 | 12/2013 | Sinyavskiy et al. | |
| 2013/0325775 A1 | 12/2013 | Sinyavskiy et al. | |
| 2013/0325777 A1 | 12/2013 | Petre et al. | |
| 2014/0012788 A1 | 1/2014 | Piekniewski | |
| 2014/0016858 A1 | 1/2014 | Richert | |
| 2014/0032458 A1 | 1/2014 | Sinyavskiy et al. | |
| 2014/0032459 A1 | 1/2014 | Sinyavskiy et al. | |
| 2014/0052679 A1 | 2/2014 | Sinyavskiy et al. | |
| 2014/0064609 A1 | 3/2014 | Petre et al. | |
| 2014/0119654 A1 | 5/2014 | Taylor et al. | |
| 2014/0122397 A1 | 5/2014 | Richert et al. | |
| 2014/0122398 A1 | 5/2014 | Richert | |
| 2014/0122399 A1 | 5/2014 | Szatmary et al. | |
| 2014/0156574 A1 | 6/2014 | Piekniewski et al. | |
| 2014/0201126 A1 | 7/2014 | Zadeh et al. | |
| 2014/0241612 A1 | 8/2014 | Rhemann et al. | |
| 2014/0379179 A1* | 12/2014 | Goossen | G08G 5/02 701/18 |
| 2015/0077639 A1 | 3/2015 | Chamaret et al. | |
| 2015/0127154 A1 | 5/2015 | Passot et al. | |
| 2015/0127155 A1 | 5/2015 | Passot et al. | |
| 2015/0181168 A1 | 6/2015 | Pahalawatta et al. | |
| 2015/0217449 A1 | 8/2015 | Meier et al. | |
| 2015/0281715 A1 | 10/2015 | Lawrence et al. | |
| 2015/0304634 A1 | 10/2015 | Karvounis | |
| 2016/0003946 A1 | 1/2016 | Gilliland et al. | |
| 2016/0009413 A1 | 1/2016 | Lee et al. | |

FOREIGN PATENT DOCUMENTS

| | | |
|---|---|---|
| RU | 2108612 C1 | 4/1998 |
| RU | 2406105 C2 | 12/2010 |
| RU | 2424561 C2 | 7/2011 |
| WO | WO-2008083335 A2 | 7/2008 |
| WO | WO-2008132066 A1 | 11/2008 |

OTHER PUBLICATIONS

Bohte, 'Spiking Nueral Networks' Doctorate at the University of Leiden, Holland, Mar. 5, 2003, pp. 1-133 [retrieved on Nov. 14, 2012]. Retrieved from the interne <ahref=http://homepages.cwi.nl/~sbohte/publication/phdthesis.pdf>http://homepages.cwi.nl/~sbohte/publication/phdthesis.pdf⁢/a><url: />.

Brette, et al., Brian: a simple and flexible simulator for spiking neural networks, The Neuromorphic Engineer, Jul. 1, 2009, pp. 1-4, doi: 10.2417/1200906.1659.

Cessac, et al., 'Overview of facts and issues about neural coding by spikes.' Journal of Physiology, Paris 104.1 (2010): 5.

Cuntz, et al., 'One Rule to Grow Them All: A General Theory of Neuronal Branching and Its Paractical Application' PLOS Computational Biology, 6 (8), Published Aug. 5, 2010.

Davison, et al., PyNN: a common interface for neuronal network simulators, Frontiers in Neuroinformatics, Jan. 2009, pp. 1-10, vol. 2, Article 11.

Djurfeldt, Mikael, The Connection-set Algebra: a formalism for the representation of connectivity structure in neuronal network models, implementations in Python and C++, and their use in simulators BMC Neuroscience Jul. 18, 2011 p. 1 12(Suppl 1): P80.

Dorval, et al., 'Probability distributions of the logarithm of inter-spike intervals yield accurate entropy estimates from small datasets.' Journal of neuroscience methods 173.1 (2008): 129.

Fidjeland, et al., "Accelerated Simulation of Spiking Neural Networks Using GPUs," WCCI 2010 IEEE World Congress on Computational Intelligence, Jul. 18-23, 2010—CCIB, Barcelona, Spain, pp. 536-543, [retrieved on Nov. 14, 2012]. Retrieved from the Internet: URL:http://www.doc.ic.ac.uld-mpsha/IJCNN10b.pdf.

Field, G., et al., Information Processing in the Primate Retina: Circuitry and Coding. Annual Review of Neuroscience, 2007, 30(1), 1-30.

Fiete, et al, Spike-Time-Dependent Plasticity and Heterosynaptic Competition Organize Networks to Produce Long Scale-Free Sequences of Neural Activity. Neuron 65, Feb. 25, 2010, pp. 563-576.

Floreano, et al., 'Neuroevolution: from architectures to learning' Evol. Intel. Jan. 2008 1:47-62, [retrieved Dec. 30, 2013] [retrieved online from: http://inforscienee.eptl.cb/record/112676/files/FloreanoDuerrMattiussi2008.pdf.

Florian, Biologically Inspired Neural Networks for the Control of Embodied Agents, Technical Report Coneural-03-03 Version 1.0 [online], Nov. 30, 2003 [retrieved on Nov. 24, 2014]. Retrieved from the Internet: http://citeseerx.ist.psu.edu/viewdoc/download-?doi=10.1.1.216.4931-&rep1&type=pdf.

Foldiak, P. Learning invariance from transformation sequences. Neural Computation, 1991, 3(2), 194-200.

Froemke et al., Temporal modulation of spike-timing-dependent plasticity, Frontiers in Synaptic Neuroscience, vol. 2, Article 19, pp. 1-16 [online] Jun. 2010 [retrieved on Dec. 16, 2013].

Gerstner et al. (1996) A neuronal learning rule for sub-millisecond temporal coding. Nature vol. 383 (6595) pp. 76-78.

Gewaltig et al., 'NEST (Neural Simulation Tool)', Scholarpedia, 2007. pp. 1-15. 2(4): 1430, doi: 1 0.4249/scholarpedia.1430.

Gleeson et al., NeuroML: A Language for Describing Data Driven Models of Neurons and Networks with a High Degree of Biological Detail, PLoS Computational Biology, Jun. 2010, pp. 1-19 vol. 6 Issue 6.

Gluck, Stimulus Generalization and Representation in Adaptive Network Models of Category Learning [online], 1991 [retrieved on Aug 24, 2013]. Retrieved from the Internet: http:// www.google.coinlurl ?sa—t&rct—j&q—Giuck+4)/022STIMULUS+GENERALIZATION+AND+REPRESENTATION+IN +ADAPTIVE+NETWORK+MODELS±OF+CATEGORY+LEARN I NG%22+1991.

Gollisch, et al., 'Rapid neural coding in the retina with relative spike latencies.' Science 319.5866 (2008): 1108-1111.

Goodman, et al., 'The Brian Simulator'. Frontiers in Neuroinformatics, Nov. 2008, pp. 1-10, vol. 2, Article 5.

Gorchetchnikov et al., NineML: declarative, mathematically-explicit descriptions of spiking neuronal networks, Frontiers in

(56) References Cited

OTHER PUBLICATIONS

Neuroinformatics, Conference Abstract: 4th INCF Congress of Neuroinformatics, doi: 1 0.3389/conffninf.2011.08.00098, (2011).
Graham, Lyle J., The Surf-Hippo Reference Manual, http://www.neurophys.biomedicale.univparis5. fr/graham/surf-hippo-files/Surf-Hippo%20Reference%20Manual.pdf, Mar. 2002, pp. 1-128.
Hopfield, JJ (1995) Pattern recognition computation using action potential timing for stimulus representation.Nature 376: 33-36.
Izhikevich, E. M, et al. (2009), Polychronous Wavefront Computations. International Journal of Bifurcation and Chaos, 19:1733-1739.
Izhikevich, E.M. (2004), Which Model to Use for Cortical Spiking Neurons? IEEE Transactions on Neural Networks, 15:1063-1070.
Izhikevich, E.M. (2008), Polychronization: Computation With Spikes. Neural Computation, 18:245-282.
Izhikevich, E.M. (2007) Dynamical Systems in Neuroscience: The Geometry of Excitability and Bursting, The MIT Press, 2007.
Izhikevich, et al., 'Relating STDP to BCM', Neural Computation (2003) 15, 1511-1523.
Izhikevich, 'Simple Model of Spiking Neurons', IEEE Transactions on Neural Networks, vol. 14, No. 6, Nov. 2003, pp. 1569-1572.
Janowitz, M.K., et al., Excitability changes that complement Hebbian learning. Network, Computation in Neural Systems, 2006, 17 (1), 31-41.
Karbowski, et al., 'Multispikes and Synchronization in a Large Neural Network with Temporal Delays', Neural Computation 12. 1573-1606 (2000).
Khotanzad, 'Classification of invariant image representations using a neural network' IEEE. Transactions on Acoustics, Speech, and Signal Processing, vol. 38, No. 6, Jun. 1990, pp. 1028-1038 [online ], [retrieved on Dec. 10, 2013]. Retrieved from the Internet <URL: http://www-ee.uta.edu/eeweb/IP/Courses/SPR/Reference/ Khotanzad.pdf.
Knoblauch, et al., Memory Capacities for Synaptic and Structural Plasticity, Neural Computation 2009, pp. 1-45.
Laurent, 'Issue 1—nnql Refactor Nucleus into its own file—Neural Network Query Language' [retrieved on Nov. 12, 2013]. Retrieved from the Internet: URL:https://code.google.com/p/nnql/issues/detail?id=1.
Laurent, 'The Neural Network Query Language (NNQL) Reference' [retrieved on Nov. 12, 2013]. Retrieved from the Internet: <URL https://code.google.com/p/ nnql/issues/detail?id=1>.
Lazar et a]. 'Multichannel time encoding with integrate-and-fire neurons.' Neurocomputing 65 (2005): 401-407.
Lazar et al. 'A video time encoding machine', in Proceedings of the 15th IEEE International Conference on Image Processing (ICIP '08 2008, pp. 717-720.
Lazar et al. 'Consistent recovery of sensory stimuli encoded with MIMO neural circuits.'Computational intelligence and neuroscience (2010): 2.
Masquelier et al., Learning to recognize objects using waves of spikes and Spike Timing-Dependent Plasticity. Neural Networks (IJCNN), The 2010 International Joint Conference on DOI—10.1109/1JCNN.2010.5596934 (2010) pp. 1-8.
Masquelier, Timothee, 'Relative spike time coding and STOP-based orientation selectivity in the early visual system in natural continuous and saccadic vision: a computational model.' Journal of computational neuroscience 32.3 (2012): 425-441.
Meister, M., et al., The neural code of the retina, Neuron, 1999, 22, 435-450.
Meister, M., Multineuronal codes in retinal signaling. Proceedings of the National Academy of sciences. 1996, 93, 609-614.
Oster M., et al., A Spike-Based Saccadic Recognition System, ISCAS 2007, IEEE International Symposium on Circuits and Systems, 2009, pp. 3083-3086.
Paugam-Moisy et al., "Computing with spiking neuron networks" G. Rozenberg T. Back, J. Kok (Eds.), Handbook of Natural Computing, Springer-Verlag (2010) [retrieved Dec. 30, 2013], [retrieved online from link.springer.com ].
Pavlidis et al. Spiking neural network training using evolutionary algorithms. In: Proceedings 2005 IEEE International Joint Conference on Neural Networkds, 2005. IJCNN'05, vol. 4, pp. 2190-2194 Publication Date Jul. 31, 2005 [online] [Retrieved on Dec. 10, 2013] Retrieved from the Internet <URL: http://citeseerx.ist.psu.edu! viewdoc/download?doi=0.1.1.5.4346&rep—repl&type-pdf.
Rekeczky, et al., "Cellular Multiadaptive Analogic Architecture: A Computational Framework for UAV Applications." May 2004.
Revow M., et al. 1996, Using Generative Models for Handwritten Digit Recognition, IEEE Trans. on Pattern Analysis and Machine Intelligence, 18, No. 6, Jun. 1996.
Sanchez, Efficient Simulation Scheme for Spiking Neural Networks. Doctoral Thesis. (Juiversita di Granada Mar. 28, 2008, pp. 1-104.
Sato et al., 'Pulse interval and width modulation for video transmission.' Cable Television, IEEE Transactions on 4 (1978): 165-173.
Schemmel, J., et al., Implementing synaptic plasticity in a VLSI spiking neural network model. In: Proceedings of the 2006International Joint Conference on Neural Networks (IJCNN'06), IEEE Press (2006) Jul. 16-21, 2006, pp. 1-6 [online], [retrieved on Aug. 24, 2012]. Retrieved from the Internet <URL: http://www.kip.uniheidelberg.deNeroeffentlichungen/download/ cgi/4620/ps/1774.pdf> Introduction.
Schnitzer, M.J., et al., Multineuronal Firing Patterns in the Signal from Eye to Brain. Neuron, 2003, 37, 499-511.
Serrano-Gotarredona, et al, "On Real-Time: AER 2-D Convolutions Hardware for Neuromorphic Spike-based Cortical Processing", Jul. 2008.
Serre, et al., 2004, Realistic Modeling of Simple and Complex Cell Tuning in the HMAX Model, and Implications for Invariant Object Recognition in Cortex, AI Memo 2004-017 Jul. 2004.
Simulink.RTM. model [online], [Retrieved on Dec. 10, 2013]Retrieved from http://www.mathworks.com/ products/simulink/index/html.
Sinyavskiy et al. 'Reinforcement learning of a spiking neural network in the task of control of an agent in a virtual discrete environment'Rus, J. Nonlin. Dyn., 2011, vol. 7, No. 4 (Mobile Robots), pp. 859-875, chapters 1-8 (Russian Article with English Abstract).
Sjostrom et al., 'Spike-Timing Dependent Plasticity' Scholarpedia, 5(2): 1362 (2010), pp. 1-18.
Szatmary et al., "Spike-timing Theory of Working Memory" PLoS Computational Biology, vol. 6, Issue 8, Aug. 19, 2010 [retrieved on Dec. 30, 2013]. Retrieved from the Internet: URL: http://www.ploscompbioLorg/article/info%3Adoi% 2F10.1371%2Fjournal.pcbi,1000879<url:></url:>.
Thorpe S.; Ultra-Rapid Scene Categorization with a Wave of Spikes. In H,H. Bulthoff et al. (eds.), Biologically Motivated Computer Vision, Lecture Notes in Computer Science, 2002, 2525, pp. 1-15, Spring-Verlag, Berlin.
Thorpe, S.J., et al., (2001). Spike-based strategies for rapid processing. Neural Networks 14, pp. 715-725.
Van Rullen, R., et al., (2003), Is perception discrete or continuous?Trends in Cognitive Sciences 7(5), pp. 207-213.
Van Rullen, R., et al., (2005). Spike times make sense. Trends in Neurosciences 28(1).
Van Rullen, R., et al., Rate Coding versus temporal order coding: What the Retinal ganglion cells tell the visual cortex. Neural computation, 2001, 13, 1255-1283.
Wallis, G., et al., A model of invariant object recognition in the visual system, Progress in Neurobiology. 1997, 51, 167-194.
Wang 'The time dimension for scene analysis.' Neural Networks, IEEE Transactions on 16.6 (2005): 1401-1426.
Wiskott, L., et al., Slow feature analysis: Unsupervised learning of invariances, Neural Computation, 2002, 14, (4), 715-770.
Wysoski et al, "Fast and Adaptive Network of Spiking Neuron for Multi-view Visual Pattern Recognition", May 3, 2008, Elsevier,Neurocomputing vol. 71, pp. 2563-2575.
Zarandy et al. "Bi-i: A Standalone Ultra High Speed Cellular Vision System." In: [online]. Dated Jun. 13, 2005 (Jun. 13, 2005). Retrieved on Aug. 16, 2012 (Aug. 16, 2012). Retrieved from the Internet at URL: http://ieeexplore.ieee.orgixplilogin.

(56) References Cited

OTHER PUBLICATIONS jsp?tp=tarnumber=14387388turl=http%3A%2Fieeexplore.ieee.org%2Fxpls%2Fabs_all.jsp% Farnumber%3D1438738.

* cited by examiner

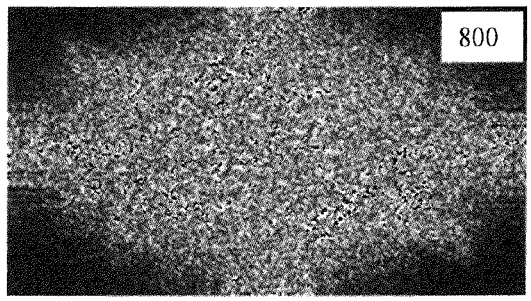 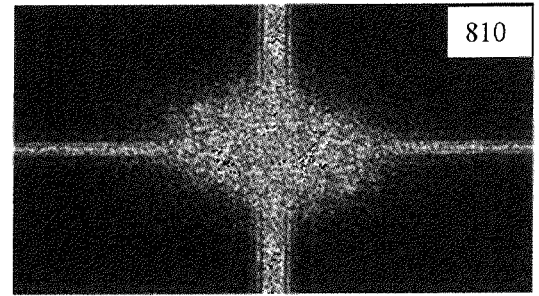
FIG. 8A  FIG. 8B
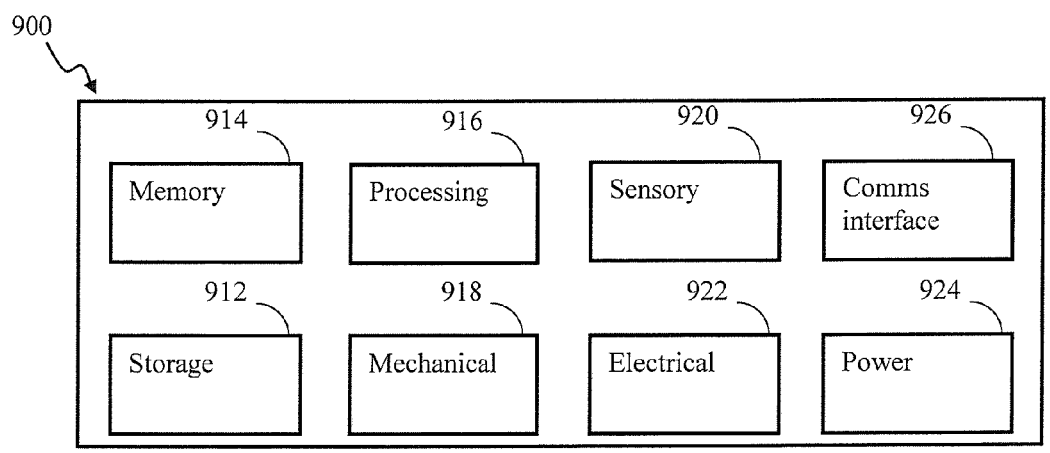
FIG. 9

OPTICAL DETECTION APPARATUS AND METHODS

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

Field of the Disclosure

The present disclosure relates to, inter alia, computerized apparatus and methods for detecting objects or targets using processing of optical data.

Description of Related Art

Object detection may be required for target approach/obstacle avoidance by autonomous robotic devices. Small sized and/or low-cost robotic vehicles may comprise limited processing and/or energy resources (and/or weight budget) for object detection.

A variety of object detection apparatus (such as IR-based, ultrasonic, and lidar) currently exist, but suffer from various disabilities. Specifically, some existing infrared (IR) optical proximity sensing methods may prove unreliable, particularly when used outdoors and/or in presence of other sources of infrared radiation. Ultrasonic proximity sensors may become unreliable outdoors, particularly on e.g., unmanned aerial vehicles (UAV) comprising multiple motors that may produce acoustic noise. The ultrasonic sensor distance output may also be affected by wind and/or humidity. Lidar based systems are typically costly, heavy, and may require substantial computing resources for processing lidar data.

Therefore there exists a need for an improved object detection sensor apparatus, and associated methods. Specifically, in one application, the improved detection sensor apparatus would be one or more of small sized, inexpensive, reliable, lightweight, power efficient, and/or capable of effective use outdoors.

SUMMARY

The present disclosure satisfies the foregoing need for an improved object detection apparatus and associated methods.

Specifically, one aspect of the disclosure relates to a non-transitory computer-readable storage medium having instructions embodied thereon, the instructions being executable to perform a method of detecting a distance to an object.

Another aspect of the disclosure relates to a non-transitory computer-readable storage medium having instructions embodied thereon, the instructions being executable on a processing apparatus to detect an object in an image. In one implementation, the detection includes: producing a high-pass filtered version of the image, the high-pass filtered version comprising a plurality of pixels; for at least some of the plurality of pixels, determining a deviation parameter between the value of a given pixel and a reference value; and based on the deviation parameter meeting a criterion, providing an indication of the object being present in the image.

In one variant, the high-pass filtered version of the image is configured produced based at least on a first convolution operation between a kernel and the image, the kernel characterized by a kernel dimension; and the convolution operation is configured to reduce energy associated spatial scales in the image that are lower than the kernel dimension. The kernel is configured for example based at least on a second convolution operation of a first matrix, the first matrix configured based at least on a Laplacian operator, and a second matrix configured based at least on a Gaussian operator; and the image is characterized by image dimension, the image dimension exceeding the kernel dimension by at least 10 ten times (10×).

In another variant, the criterion comprises meeting or exceeding a prescribed threshold.

In another aspect of the disclosure, an optical object detection apparatus is disclosed. In one implementation, the apparatus includes: a lens characterized by a depth of field range; an image sensor configured to provide an image comprising one or more pixels; and logic in communication with the image sensor. The logic is configured to in one variant: evaluate at least a portion of the image to determine an image contrast parameter; and produce an object detection indication based on the contrast parameter breaching a threshold meeting one or more criteria, the object indication configured to convey presence of the object within the depth of field range.

In another variant, the image sensor comprises an array of photo-sensitive elements arranged in a plane disposed substantially parallel to the lens; and the image comprises an array of pixels, individual pixels being produced by individual ones of the photo-sensitive elements.

In another aspect, a method of navigating a trajectory by a robotic apparatus is disclosed. In one implementation, the apparatus includes a controller, an actuator and a sensor, and the method includes: obtaining at least one image associated with surroundings of the apparatus using the sensor; analyzing the at least one image to determine a contrast parameter of the image; detecting a presence of an object in the at least one image based at least in part on based on the contrast parameter meeting one or more criteria; and causing the controller to activate the actuator based on the detection of the presence of the object. In one variant, the actuator activation is configured consistent with a characteristic of the object.

In another variant, the robotic device comprises a vehicle; the object comprises one of a target or an obstacle; and the actuator activation is configured to cause the vehicle to perform at least one of a target approach or obstacle avoidance action.

In another implementation, the method includes: obtaining at least one image associated with surroundings of the apparatus using the sensor; analyzing the at least one image to detect a presence of an object in the at least one image; determining that the detected object comprises one of either a target or an obstacle; and causing the controller to selectively activate the actuator based on the determination.

In another aspect of the present disclosure, a method of navigating a robotic apparatus is disclosed. In one embodiment, the robotic apparatus includes a controller, an actuator and a sensor, and the method includes: obtaining, through a lens, at least one image associated with surroundings of the apparatus using the sensor, the sensor including a plurality of image detectors disposed at an angle with respect to a plane of the lens, each of the plurality of image detectors being associated with an extent located in the surroundings; analyzing the at least one image to detect a presence of one or more objects in the at least one image; during the navigating of the robotic apparatus, detecting a distance to the one or more objects based on the presence of at least one of the one or more objects within the extent located in the surroundings; determining that the detected object includes one of either a target or an obstacle; and causing the controller to selectively activate the actuator based on the determination.

In another aspect of the present disclosure, an apparatus is disclosed. In one embodiment, the apparatus is configured to cause a robotic device to navigate a trajectory, and the apparatus includes a non-transitory computer-readable medium including a plurality of instructions configured to cause the apparatus to, when executed by a processor: obtain an image associated with surroundings of the apparatus using a sensor of the device, the sensor including multiple discrete image sensors behind a single lens associated therewith, each of the multiple discrete image sensors being associated with respective extents located in the surroundings of the apparatus; analyze the image to determine a contrast parameter of the image; detect a presence of an object in the image based at least in part on the contrast parameter meeting one or more criteria; and cause a controller of the device to activate an actuator of the device based on the detection of the presence of the object; wherein the actuator is configured to be activated based on a characteristic of the object; and wherein during the navigation of the trajectory by the robotic device, the apparatus is configured to determine (i) a first distance to the object when the presence of the object produces a first in-focus representation within a first extent of the respective extents and (ii) a second distance to the object when the presence of the object produces a second in-focus representation within a second extent of the respective extents.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosure. As used in the specification and in the claims, the singular form of "a", "an", and "the" include plural referents unless the context clearly dictates otherwise.

BRIEF DESCRIPTION OF THE DRAWINGS

FIG. 8A is a plot illustrating a power spectrum of a de-focused image obtained with an optical distance detection system, according to one or more implementations.

FIG. 8B is a plot illustrating a power spectrum of an in-focus image obtained with an optical distance detection system, according to one or more implementations.

FIG. 9 is a functional block diagram illustrating a computerized apparatus for implementing, inter alia, object detection in accordance with one or more implementations.

Figure 1:
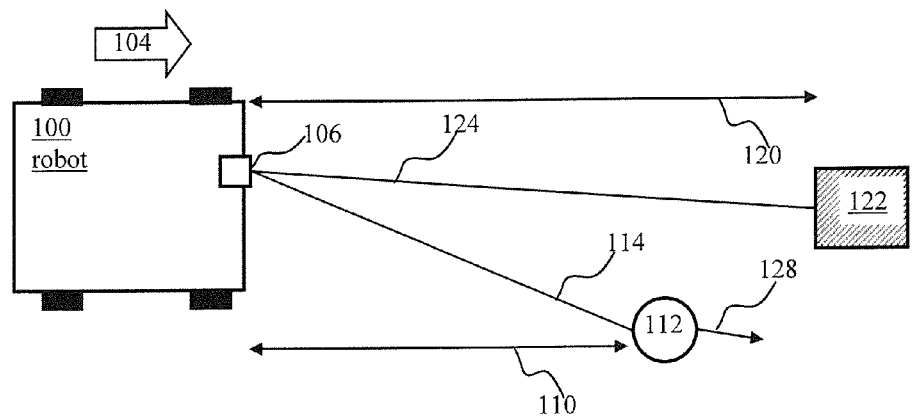
FIG. 1 is a graphical illustration depicting a top view of robotic apparatus configured for optical distance detection, in accordance with one or more implementations.

All Figures disclosed herein are © Copyright 2014 Brain Corporation. All rights reserved.

DETAILED DESCRIPTION

Implementations of the present disclosure will now be described in detail with reference to the drawings, which are provided as illustrative examples so as to enable those skilled in the art to practice the present technology. Notably, the figures and examples below are not meant to limit the scope of the present disclosure to a single implementation, but other implementations are possible by way of interchange of or combination with some or all of the described or illustrated elements. Wherever convenient, the same reference numbers will be used throughout the drawings to refer to same or like parts.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation may be combined with one or more features of any other implementation In the present disclosure, an implementation showing a singular component should not be considered limiting; rather, the disclosure is intended to encompass other implementations including a plurality of the same component, and vice-versa, unless explicitly stated otherwise herein.

Further, the present disclosure encompasses present and future known equivalents to the components referred to herein by way of illustration.

As used herein, the term "bus" is meant generally to denote all types of interconnection or communication architecture that is used to access the synaptic and neuron memory. The "bus" could be optical, wireless, infrared or another type of communication medium. The exact topology of the bus could be for example standard "bus", hierarchical bus, network-on-chip, address-event-representation (AER) connection, or other type of communication topology used for accessing, e.g., different memories in pulse-based system.

As used herein, the terms "computer", "computing device", and "computerized device", include, but are not limited to, personal computers (PCs) and minicomputers, whether desktop, laptop, or otherwise, mainframe computers, workstations, servers, personal digital assistants (PDAs), handheld computers, embedded computers, programmable logic device, personal communicators, tablet or "phablet" computers, portable navigation aids, J2ME equipped devices, smart TVs, cellular telephones, smart phones, personal integrated communication or entertainment devices, or literally any other device capable of executing a set of instructions and processing an incoming data signal.

As used herein, the term "computer program" or "software" is meant to include any sequence or human or machine cognizable steps which perform a function. Such program may be rendered in virtually any programming language or environment including, for example, C/C++, C#, Fortran, COBOL, MATLAB™, PASCAL, Python, assembly language, markup languages (e.g., HTML, SGML, XML, VoXML), and the like, as well as object-oriented environments such as the Common Object Request Broker Architecture (CORBA), Java™ (including J2ME, Java Beans), Binary Runtime Environment (e.g., BREW), and other languages.

As used herein, the terms "connection", "link", "synaptic channel", "transmission channel", "delay line", are meant generally to denote a causal link between any two or more entities (whether physical or logical/virtual), which enables information exchange between the entities.

As used herein the term feature may refer to a representation of an object edge, determined by change in color, luminance, brightness, transparency, texture, and/or curvature. The object features may comprise, inter alia, individual edges, intersections of edges (such as corners), orifices, and/or curvature As used herein, the term "memory" includes any type of integrated circuit or other storage device adapted for storing digital data including, without limitation, ROM. PROM, EEPROM, DRAM, Mobile DRAM, SDRAM, DDR/2 SDRAM, EDO/FPMS, RLDRAM, SRAM, "flash" memory (e.g., NAND/NOR), memristor memory, and PSRAM.

As used herein, the terms "processor", "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., field programmable gate arrays (FPGAs)), PLDs, reconfigurable computer fabrics (RCFs), array processors, secure microprocessors, and application-specific integrated circuits (ASICs). Such digital processors may be contained on a single unitary IC die, or distributed across multiple components.

As used herein, the term "network interface" refers to any signal, data, or software interface with a component, network or process including, without limitation, those of the FireWire (e.g., FW400, FW800, and/or other FireWire implementation.), USB (e.g., USB2), Ethernet (e.g., 10/100, 10/100/1000, Gigabit Ethernet, 10-Gig-E), MoCA, Coaxsys (e.g., TVnet™), radio frequency tuner (e.g., in-band or OOB, cable modem), Wi-Fi (802.11), WiMAX (802.16), PAN (e.g., 802.15), cellular (e.g., 3G, LTE/LTE-A/TD-LTE, GSM, and/or other cellular interface implementation) or IrDA families.

As used herein, the term "Wi-Fi" refers to, without limitation, any of the variants of IEEE-Std. 802.11 or related standards including 802.11 a/b/g/n/s/v and 802.11-2012.

As used herein, the term "wireless" means any wireless signal, data, communication, or other interface including without limitation Wi-Fi, Bluetooth, 3G (3GPP/3GPP2), HSDPA/HSUPA, TDMA, CDMA (e.g., IS-95A, WCDMA, and/or other wireless interface implementation.), FHSS, DSSS, GSM, PAN/802.15, WiMAX (802.16), 802.20, narrowband/FDMA, OFDM, PCS/DCS, LTE/LTE-A/TD-LTE, analog cellular, CDPD, RFID or NFC (e.g., EPC Global Gen. 2, ISO 14443, ISO 18000-3), satellite systems, millimeter wave or microwave systems, acoustic, and infrared (e.g., IrDA).

The present disclosure provides, among other things, apparatus and methods for detecting objects at a given distance from a moving device (such as e.g., a robotic device) in real time.

An optical distance/detection apparatus may comprise sensory apparatus, such as a camera comprising an imaging sensor with a lens configured to project a representation of a visual scene onto the imaging sensor. For a given lens, objects at different distances in front the lens may appear to focused at different ranges behind the lens. The lens may be characterized by a range of sharp focus (also referred to as depth of field). For a given range between the image sensor and the lens, one or more objects present within the range of focus may produce in-focus images. Objects disposed outside the range of focus may produce smeared (or out of focus) images. In-focus representations of objects may be characterized by a greater contrast parameter compared to out-of-focus representations. One or more images provided by the detection apparatus may be analyzed in order to determine image contrast parameter of a given image. Based on one or more criteria (e.g., the image contrast breaching a threshold), an object detection indication may be produced by the apparatus.

When operated from a moving vehicle or device (e.g., a car, an aerial vehicle) the image on the detector may gradually get sharper as the vehicle approaches an object. Upon breaching a given contrast (given sharpness) threshold, the detection apparatus may produce an indication conveying presence of an object within the range of focus in front of the lens.

FIG. 1 depicts a top view of mobile robotic apparatus comprising an optical object detection device configured for object detection in accordance with some implementations. The apparatus 100 may comprise for instance a robotic car, an unmanned aerial vehicle, and/or other apparatus configured to move in space in one or more dimensions. The apparatus 100 may comprise the optical object detection device 106. The apparatus 100 may navigate in a direction 104. One or more objects may be present in front of the apparatus 100, e.g., a ball 112 and a box 122, disposed at distance 110, 120, respectively, from the apparatus 100. The object detection device 106 may be configured to detect the presence of one or more objects (e.g., 112, 122) during, for example trajectory navigation by the apparatus 100 using the methodology of the disclosure.

Figure 2:
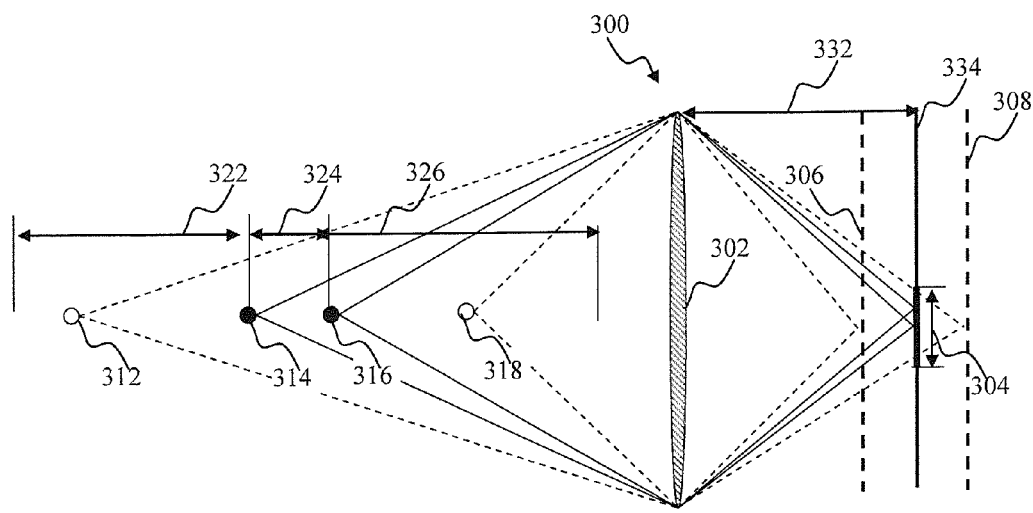
FIG. 2 is a diagram illustrating focal configuration of an optical apparatus used for distance detection, according to one or more implementations.

FIG. 2 illustrates a configuration of an optical apparatus used for object detection, according to one or more implementations. The apparatus 300 of FIG. 2, may comprise a lens 302 characterized by a focal length 332. A portion of the space to the left of the lens 302 in FIG. 2 may be referred to as the front (e.g., object space). A lens may be characterized by a relative aperture (also referred to as the f-number and/or focal number and defined as a ratio of lens focal length (e.g., element 332 in FIG. 2) to the diameter of the lens entrance pupil).

The apparatus 300 may comprise an image sensor disposed behind the lens 304. In some implementations, the sensor may be located at a fixed distance from the lens, e.g., in the focal plane 334 of the lens 302.

The lens 302 may be characterized by an area of acceptable contrast which also may be referred to as a circle of confusion (CoC). In optics, a circle of confusion may correspond to a region in a plane of the detector formed by a cone of light rays from a lens that may not coming to a perfect focus when imaging a point source. The area of acceptable contrast may also be termed to as disk of confusion, circle of indistinctness, blur circle, or region. The area of acceptable contrast of the lens 302 (denoted by bold segment in FIG. 2) of extent 304 may correspond to an extent of acceptably sharp focus 324 in front of the lens 302. In some implementations, the dimension (e.g., vertical in FIG. 2) of the acceptable contrast 304 may be configured based on, for example, one or more criteria such as an acceptable difference in brightness between (i) pixels corresponding to the light rays falling onto the detector within the area 304, and (ii) pixels corresponding the light rays falling onto the focal plane outside the area 304. The magnitude of the pixel brightness difference may be configured in accordance with parameters of a particular application (e.g., object distance, size, shape, image resolution, acquisition time and/or other parameters). In some implementations of object detection from an aerial vehicle for example, the magnitude of the pixel brightness difference may be selected between 10% and 20%.

In some implementations of still or video image processing, dimension of the circle of confusion may be determined based on a size of the largest blur spot that may still be perceived by the processing apparatus as a point. In some photography implementations wherein the detector may comprise a human eye, a person with a good vision may be able to distinguish an image resolution of 5 line pairs per millimeter (lp/mm) at 0.25 in, which corresponds to CoC of 0.2 mm.

In one or more implementations of computerized detectors, the DOF dimension may be determined as $$R \sim 1/dc,\ dc \sim d/dr/Rv \qquad \text{(Eqn. 1)}$$

where:
d is the viewing distance, dr is the minimum detectable resolution at a reference viewing distance, Rv—is the reference viewing distance.

For a given detector size and/or location, and sharpness threshold, the dimension 304 of the area of acceptable contrast may increase with an increasing f-number of the lens 302. By way of an illustration, the circle of confusion of a lens with f-number of 1.4 (f/1.4) will be twice that of the f/2.8 lens. Dimension of the area of acceptably sharp focus 324 in FIG. 2 (also referred to as the depth of field (DOF)) may be inversely proportional to the dimension 304 of the area of acceptable contrast and the lens f-number. In the above example, the DOF of the f/1.4 lens will be half that of the f/2.8 lens.

A plurality of objects (denoted by circles 312, 314, 316, 318 in FIG. 2) may be present in front of the lens 302. Axial extents denoted by arrows 322 and 326 in FIG. 2 may be referred to as out-of-focus portions, while the extent 324 may be referred to as the in-focus portion of the space in front of the lens. Objects that may be present within the DOF (e.g., the objects 314, 316 shown by solid circles in FIG. 2) produce in-focus image representations in the focal plane 334. Objects that may be present outside the DOF (e.g., the objects 312, 318 shown by open circles in FIG. 2) produce out-of-focus image representations in the focal plane 334. By way of an illustration, the object 312 may produce an out of focus image at the detector plane 334, the object 314 may produce an in-focus image at the detector plane 334.

In some implementations, a lens with a lower relative aperture (smaller f number) may be capable of producing a shallower depth of field (e.g., 324 in FIG. 2). An optical detection apparatus characterized by a shallow depth of field may reduce uncertainty associated with detecting objects using image contrast methodology described herein. A detection system 300 characterized by a shallower area of acceptably sharp focus may be used to achieve reliable detection (e.g., characterized by a lower rate of false positives) compared to a detection system characterized by a deeper area of acceptably sharp focus. In some implementations of object detection from a moving platform and/or detection of moving objects, a detection system characterized by the shallower DOF may be operated at an increased temporal resolution (compared to the deeper DOF system) in order to detect objects that may pass through the area of acceptably sharp focus.

In some implementations, e.g., such as illustrated in FIG. 1, the apparatus 200 may be disposed on a moving platform. As the platform approaches an object (e.g., 122 in FIG. 1) being present in the out-of focus area 322, the object, when at location 312 in FIG. 2, may produce an out of focus representation in the image. When the object becomes located within the apparatus 300 DOF (e.g., the location 314, and/or 316 of the extent 324 or there between), it may produce an in-focus representation. The in-focus representation may be characterized by one or more changes, such as e.g., an increased contrast as compared to the output focus representations. In such a case, analysis of the image contrast may be utilized in order to determine the presence of one or more objects in the image, e.g., as described below with respect to FIGS. 6-8B.

Figure 3:
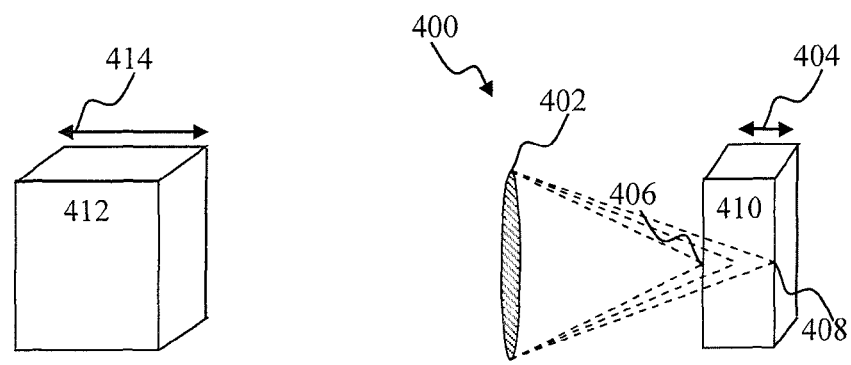
FIG. 3 is a graphical illustration depicting distance detection volume associated with a three-dimensional image detector, according to one or more implementations.

In some implementations, the contrast determination process may comprise one or more computer-implemented mathematical operations, including down-sampling the image produced by the detector; performing a high-pass filter operation on the acquired image; and/or determining a deviation parameter of pixels within the high-pass filtered image relative a reference value. FIG. 3 depicting an exemplary distance detection apparatus 400 comprising a three-dimensional image detector, according to one or more implementations. The apparatus 400 may comprise for instance a lens 402, and a three dimensional image sensor 410. The image sensor may comprise a charge-coupled device (CCD), CMOS device, an active-pixel sensor (APS), photodiode array, and/or other sensor technology. The image sensor may be configured to provide two-dimensional (e.g. X-Y) matrices of a pixel intensity values refreshed at, e.g., a 25 Hz or other suitable frame rate. In one or more implementations, the image sensor may operate at a single wavelength, or at multiple wavelengths. It will be appreciated that while many applications of the apparatus 400 may be configured to operate within the visual band of wavelengths, the present disclosure contemplates use of other wavelengths of electromagnetic energy including, without limitation, those in IR, microwave, x-ray, and/or gamma-ray bands, or combinations of the foregoing. A given pixel may be characterized by one or more values, e.g., corresponding to individual wavelengths (R, G, B), and/or exposure. Individual values may be characterized by bit depth (e.g., comprising 8, 12, 16, or other number of bits). It will be appreciated by those skilled in the art when given this disclosure that the above-referenced image parameters are merely exemplary, and many other image representations (e.g., bitmap, luminance-chrominance (YUV, YCbCr), grayscale, and/or other image representations) are equally applicable to and useful with the various aspects of the present disclosure. Futhermore, data frames corresponding to other (non-visual) signal modalities such as infrared (IR), ultra-violet (UV) images may be compatible with the processing methodology of the disclosure, or yet other configurations.

The image sensor 410 may comprise one or more sensing layers arranged along dimension shown by arrow 404. Individual layers (not shown) may comprise a plurality of photo sensitive elements (photosites) configured to produce arrays of pixels. Individual sensing layers may be configured partially translucent so as to permit light delivered by the lens 402 propagation through a prior layer (with respect to the lens) to subsequent layer(s). Axial displacement of individual layers (e.g., along dimension 404) may produce an axial distribution of focal planes. Light rays propagating through the lens 402 at different angles may be focused at different locations, as shown by broken lines 406, 408 in FIG. 3. Spatial separation of multiples focal planes may enable detection of objects disposed within the extent 412 in front of the lens. Objects disposed at different ranges 414 from the lens within the extent 410 may produce in focus images at a respective focal plane of the image sensor 410. In some implementations, the apparatus 400 may be used to provide distance to the detected object.

Figure 4A:
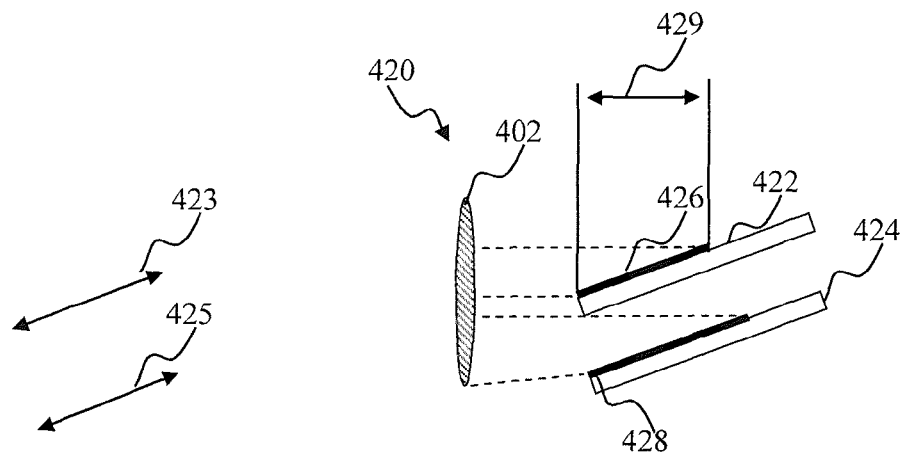
FIG. 4A is a graphical illustration depicting an object detection apparatus comprising a slanted linear image detector, according to one or more implementations.

FIG. 4A illustrates an object detection apparatus comprising a slanted linear image detector, according to one or more implementations. The apparatus 420 of FIG. 4A may comprise a lens 402, and one or more image sensors 422, 424. Individual image sensors 422, 424 may comprise a linear array of photosites disposed at an angle with respect to the plane of the lens 402. Configuring the image sensor 422, 424 at an angle with respect to the lens 402 may enable the apparatus 420 to produce one or more areas of focus 426, 428. Areas of focus may be characterized by an axial horizontal extent, e.g., element 429 of the area 426 in FIG. 4A. Slanted areas of focus may correspond to multiple in-focus extents to the left of the lens 402, e.g. shown by arrows 423, 425. Objects occurring within the one or more extents 423, 425 may produce an in-focus representation on the respective sensor. Use of one or more slanted image sensors may enable the apparatus 420 to detect objects at multiple locations that differ by distance from the lens plane and the cross axis position. In some implementations, detection of objects at multiple distances may enable a robotic vehicle to determine as to whether obtain information if its approaching an object (or if it is approached by an object) and undertake a relevant action (e.g. avoid an obstacle and/or move away from a trajectory of another object). In one or more implementations, the detection apparatus 420 may be employed to determine shape and/or aspect ratio of an object. By way of an illustration, number and/or location of activated slant sensors (e.g., 422, 424) of the slant array may convey information about object's location, orientation and/or shape.

Figure 4B:
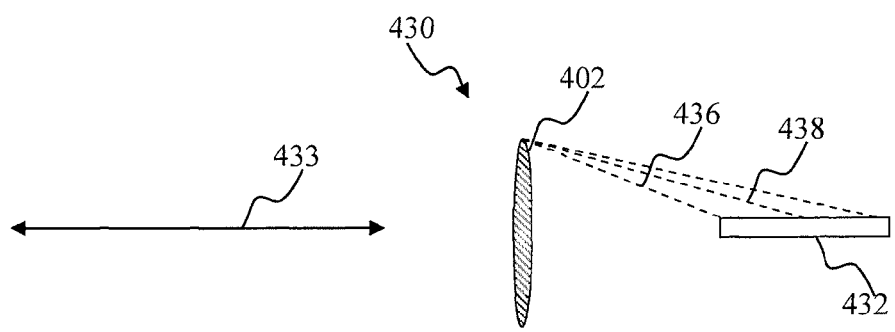
FIG. 4B is a graphical illustration depicting an object detection apparatus comprising a horizontal linear image detector, according to one or more implementations.

FIG. 4B illustrates an object detection apparatus comprising a horizontal linear image detector, according to one or more implementations. The apparatus 430 of FIG. 4B may comprise a lens 402, and an image sensor 432 comprising a linear array of photosites disposed along axial direction of the lens 402. Disposing the image sensor 432 at a right angle with respect to the lens 402 plane may enable the apparatus 430 to produce in-focus images when an object may be present within the in-focus range 433 in front of the lens 402. When one or more objects may occur within the range 433 at different ranges from the lens, distance to individual objects may be resolved by, in one implementation, analyzing in-focus representations corresponding to light rays 436, 438 in FIG. 4B.

Figure 4C:
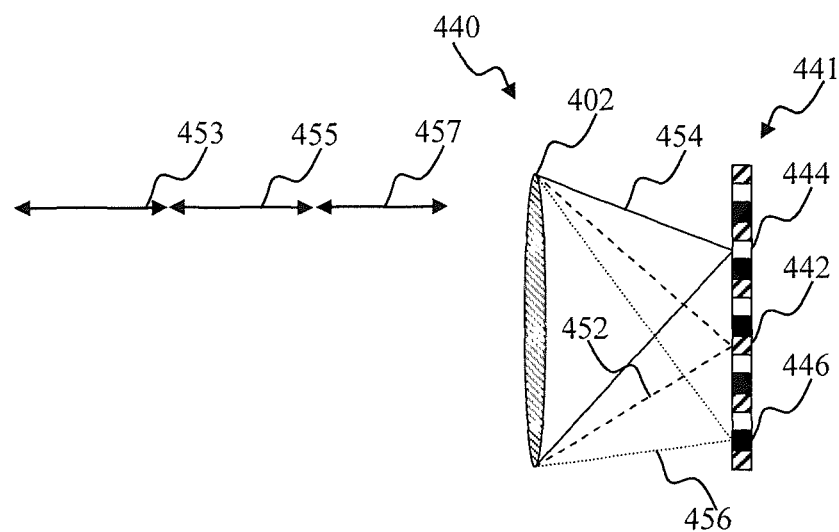
FIG. 4C is a graphical illustration depicting a distance detection apparatus comprising detectors of multiple wavelengths, according to one or more implementations.

FIG. 4C illustrates a distance detection apparatus comprising an image sensor comprising detectors of multiple wavelengths, according to one or more implementations. The apparatus 440 of FIG. 4C may comprise a lens 402, and an image sensor 441. The image sensor 441 may comprise a linear array of photosites disposed along focal plane direction (vertical in FIG. 4C) of the lens 402. The photosite array may comprise elements configured to respond to light waves of different wavelength. The sensor 441 shown in FIG. 4C comprises three element types depicted by open, solid, and hashed rectangles denoted 444, 446, 442, respectively. Individual photosites of a given type (e.g., 444, 446, 442 in FIG. 4C) may be configured in an array, thus producing multiple image sensors disposed within the focal plane of the lens 402.

Due to light dispersion within the lens, light traveling along different paths may focus in different areas behind the lens. Conversely, objects disposed at different distances from the lens may produce in-focus representations at image sensors responding to different light wavelengths. By way of an illustration, light from objects within the distance range 453 may travel along ray paths 454 and produce in focus image on photosite type 444 array. Light from objects within the distance range 455 may travel along ray paths 456 and produce in focus image on photosite type 446 array. Light from objects within the distance range 457 may travel along ray paths 452 and produce in focus image on photosite type 442 array. Accordingly, the optical apparatus comprising one or more image sensors operating at multiple wavelengths may be capable of providing distance information for objects located at different distance from the lens. Although chromatic aberration is known in the arts, most modern lenses are constructed such as to remove or minimize effects of chromatic aberration. Such achromatic and/or apochromatic lenses may be quite costly, heavy, and/or large compared to simpler lenses with chromatic aberration. The methodology of the present disclosure may enable use of simpler, less costly, and/or more compact lens designs for detecting objects compared to existing approaches.

Figure 4D:
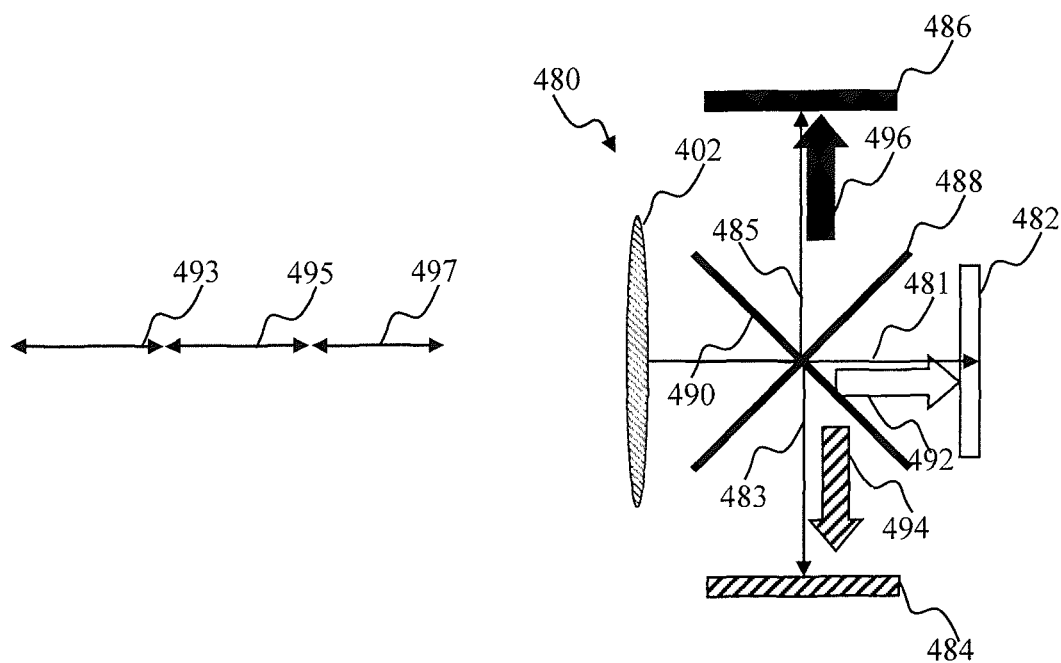
FIG. 4D is a graphical illustration depicting an extended range distance detection apparatus comprising multiple detectors, according to one or more implementations.

FIG. 4D illustrates an extended range distance detection apparatus comprising multiple detectors, according to one or more implementations.

The apparatus 480 of FIG. 4B may comprise a lens 402, and multiple image sensors 482, 484, 486. Individual image sensors 482, 484, 486 may be configured to respond to light of one or more wavelengths. Individual image sensors 482, 484, 486 may be disposed at different optical distances from the lens 402. In some implementations, such as shown in FIG. 4D, one or more light deflection components may be used in order to divert a portion of light gathered by the lens into two or more portions. In one or more implementations, the components 488, 490 may comprise a beam splitter, a polarizing prism, and/or a thin half-silvered mirror (pellicle mirror).

By way of an illustration, a portion of the light from the lens 402 may be diverted by semi-permeable mirror 488 along direction shown by arrow 496 towards the sensor 486 while a portion 492 of light may be passed through towards the sensor 482. All or a portion of the light from the lens 402 may be diverted by the semi-permeable mirror 490 along direction shown by arrow 494 towards the sensor 484. A portion 492 of the incident light may be passed through towards the sensor 482. Cumulative path lengths for light sensed by elements 482, 484, 486 may also be configured different from one another. Accordingly, the light traveling along paths denoted by arrows 481, 483, 485 may correspond to depth of field regions 493, 495, 497 in front of the lens 402 in FIG. 4D. Optical apparatus comprising multiple image sensors characterized by different light path lengths may be capable of providing detection information for objects located at different distance from the lens.

Figure 5A:
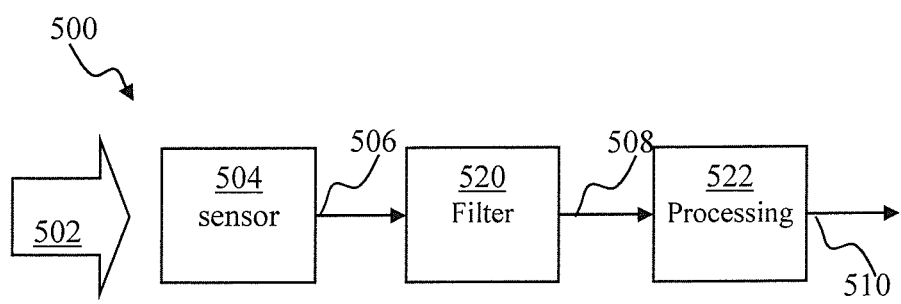
FIG. 5A is a block diagram depicting an exemplary object detection apparatus, according to one or more implementations.

FIG. 5A is a block diagram depicting an exemplary object detection apparatus, according to one or more implementations. The apparatus 500 of FIG. 5A may comprise one or more sensors 504 configured to produce one or more pixels corresponding to sensory input 502. In one or more implementations, the sensory input may comprise light gathered by a lens. In one or more implementations of optical distance detection, the sensor component 504 may comprise one or more image sensor components, such as e.g., those described above with respect to FIGS. 3-4D.

The sensor 504 may provide output 506 comprising one or more pixels. In some implementations, the output 506 may comprise an array of pixels characterized by one or more channels (e.g., R,G,B) and a bit depth (e.g., 8/12/16 bits).

The output 506 may be high-pass (HP) filtered by the filter component 520. In some implementations, the filter component 520 may be configured to downsample the input 506. The filter component 520 operation may comprise a convolution operation with a Laplacian and/or another sharpening kernel, a difference of Gaussian operation configured to reduce low frequency energy, a combination thereof, and/or other operations configured to reduce low frequency energy content. In some implementations, the filter component 520 may be configured as described below with respect to FIG. 6A.

In some implementations, the output 506 might be cropped prior to further processing (e.g., filtering, and/or transformations). Multiple crops of an image in the output 506 (performed with different cropping setting) may be used. In some implementations crops of the high-passed image may be utilized. In some implementations, the output 506 may be processed using a band-pass filter operation. The band pass filter may comprise a high-pass filtering operation, subsampling, and/or a blurring filter operation. The blurring filter operation on an image may comprise a convolution of a smoothing kernel (e.g., Gaussian, box, circular, and/or other kernel whose Fourier transform has most of energy in a low part of spectrum) with the image.

Filtered output 508 may be provided to a processing component 522 configured to execute a detection process. The detection process may comprise determination of a parameter, quantity, or other value, such as e.g., a contrast parameter. In one or more implementations, the contrast parameter may be configured based on a maximum absolute deviation (MAD) of pixels within the filtered image from a reference value. The reference value may comprise a fixed pre-computed value, an image mean, image median, and/or a value determined using statistics of multiple images. In some implementations, the contrast parameter for a plurality of images value may be low-pass filtered using a running mean, an exponential filter, and/or other filter approach configured to reduce inter-image variability of the detection process, or accomplish some other desirable operation to enhance detection. The averaging window may be configured in accord with requirements of a given application. By way of an illustration, a detection apparatus configured to detect objects in a video acquired at 25 fps from a robotic rover device may utilize averaging window between 2 and 50 frames. It will be appreciated by those skilled in the arts that averaging parameters may be configured based on requirements of an applications, e.g., vehicle speed, motion of objects, object size, and/or other parameters. For autonomous ground vehicle navigation the averaging window may be selected smaller than 2 seconds.

The contrast parameter may be evaluated in light of one or more detection or triggering criteria; e.g., compared to a threshold, and/or analysis of a value produced by the contrast determination process. Responsive to the contrast parameter for a given image breaching the threshold (e.g., 604, 624 in FIGS. 6A-6B, below), the processing component 522 may produce output 510 indicative of a presence of an object in the sensory input 500. In one or more implementations, the threshold value may be selected and/or configured dynamically based on, e.g., ambient light conditions, time of day, and/or other parameters. By way of an illustration, the threshold may be configured to provide greater sensitivity at dusk/dawn, and reduce sensitivity during the day and/or increase sensitivity in high light conditions, while reducing sensitivity in low light conditions.

Figure 5B:
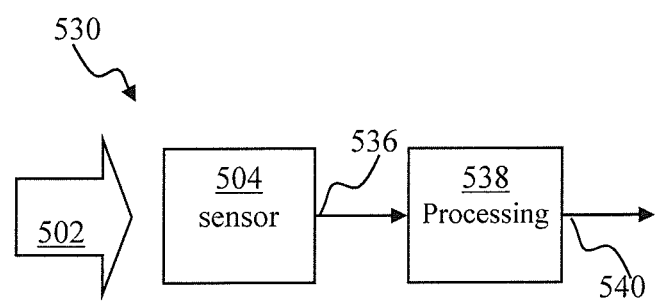
FIG. 5B is a block diagram depicting an exemplary object detection apparatus, according to one or more implementations.

FIG. 5B illustrates an exemplary object detection apparatus, according to one or more implementations. The apparatus 530 of FIG. 5B may comprise one or more sensors 504 configured to produce output 536 comprising one or more pixels corresponding to sensory input 502. In one or more implementations, the sensory input may comprise light gathered by a lens. In one or more implementations of optical distance detection, the sensor component 504 may comprise one or more image sensor components described above with respect to FIGS. 3-4D. The output 536 may comprise an array of pixels characterized by one or more channels (e.g., R,G,B) and a bit depth (e.g., 8/12/16 bits).

The output 536 may be processed by a processing component 538. In some implementations, the component 538 may be configured to assess spatial and/or temporal characteristics of the camera component output 536. In some implementations, the assessment process may comprise determination of a two-dimensional image spectrum using, e.g., a discrete Fourier transform described below with respect to FIG. 6B. The resultant spectrum may be analyzed to evaluate high-frequency (small scale) energy content. In some implementations, the high frequency energy content determination may comprise a determination of energy parameter (Ehi) associated with energy content in the image spectrum at spatial scales that are lower than 0.5-⅔ of the Nyquist frequency (3-10) pixels.

Responsive to a determination that the high frequency (small spatial scale) energy content in the image meets one or more criteria (e.g., breaches a threshold), the processing component 538 may produce output 540 indicative of a presence of an object in the sensory input 502. In one or more implementations, the threshold value may be selected and/or configured dynamically based on, e.g., ambient light conditions, time of day, and/or other parameters.

In one or more implementations, the object detection may be effectuated based on a comparison of the Ehi parameter to another energy parameter (El) associated with energy content in the image spectrum at spatial scales that exceed a prescribed number of pixels.

In one or more implementations, processing components 520, 522, 524, 538 may be embodied within one or more integrated circuits, one or more computerized devices, and/or implemented using machine executable instructions (e.g., a software library) executed by one or more processors and/or ASICs.

FIGS. 6A-8B illustrate operation of object detection system of the disclosure configured in accordance with one or more implementations.

Figure 7A:
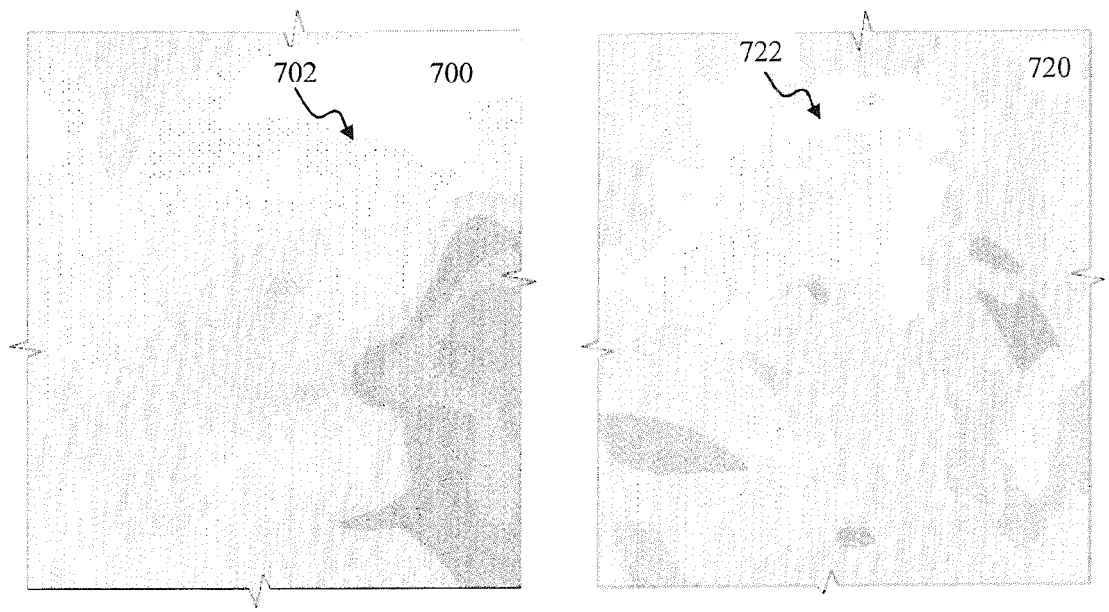
FIG. 7A is a plot illustrating de-focused images obtained with an optical distance detection system, according to one or more implementations.
Figure 7B:
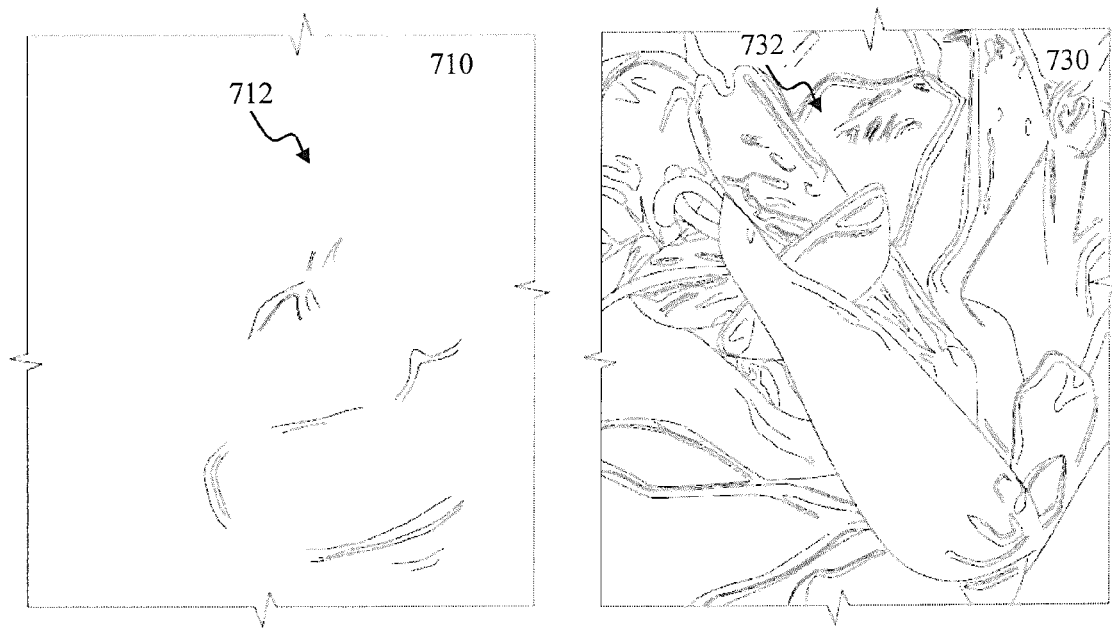
FIG. 7B is a plot illustrating in-focus images obtained with an optical distance detection system, according to one or more implementations.

One or more images may an acquired using, e.g. a camera component 504 shown and described with respect to FIG. 5A mounted on a vehicle (e.g., a robotic vehicle 100 such as that shown in FIG. 1). The vehicle may approach an object (e.g., a flower). FIGS. 7A-7B present two exemplary images acquired with a camera apparatus comprising a lens (e.g., 302 in FIG. 2) characterized by an exemplary f/1.8 aperture and 35 mm focal length, and an imaging sensor (e.g., 304 in FIG. 2) characterized by dimensions of 23.1 mm by 15.4 mm. The image sensor may comprise an array of photosites and be characterized by a physical resolution (e.g., 6,016× 4,000) of photosites. The image sensor may produce an image comprising an array of pixels. Individual pixels may correspond to signal associated with a given photosite (raw resolution) or a group of photosites (subsampled image). Images provided by the sensor may be down-sampled to e.g., 320 pixels×180 pixels rectangle and converted to grayscale 8-bit representation. Various other resolutions, bit depths and/or image representations may be utilized. The pixels dimension may determine the smallest resolvable spatial scale (e.g., smallest change) in the image. For example, smaller pixels may enable resolving of smaller scales (higher detail) in the image.

Image 700 in FIG. 7A represents the down-sampled image comprising an out of-focus representation of the object (e.g., the flower), denoted by arrow 702. Image 720 in FIG. 7B represents the down-sampled image comprising an in-focus representation 722 of the flower.

The images may be high-pass processed by a filtering operation. The filtering operation may comprise determination of a Gaussian blurred image using a Gaussian kernel. In the implementation illustrated in FIGS. 6A-7B the Gaussian kernel standard deviation is selected equal to 5 pixels in vertical and horizontal dimensions. It may be appreciated by those skilled in the relevant arts that the image acquisition and/or processing parameters (e.g., bit depth, down-sampled image size, Gaussian kernel, and/or other parameters) may be configured in accordance with application requirements; e.g., expected object size, processing and/or energy capacity available for object detection, image sensor size, resolution, frame rate, noise floor, and/or other parameters.

Figure 6A:
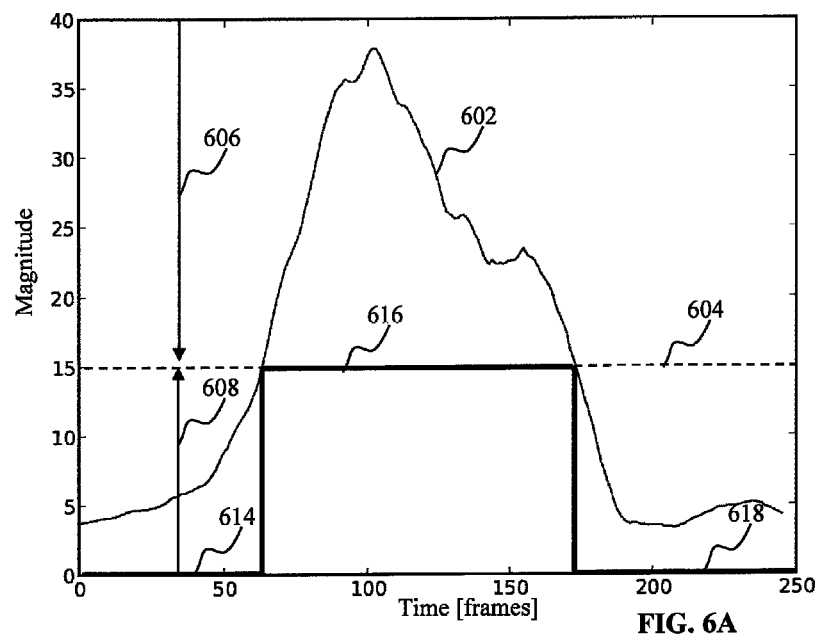
FIG. 6A is a plot illustrating output of an optical signal detection apparatus (e.g., the apparatus 500 of FIG. 5A), according to one or more implementations.

In one or more implementations, the high-passed image Ih may be obtained by subtracting Gaussian blurred image Ig from the original image I, as follows:

$$I_h = I + m - I_g \qquad \text{(Eqn. 2)}$$

where m denotes an offset value. In some implementations (e.g., such as illustrated in FIGS. 6A, 7A-7B), the offset m may be selected equal to a middle value of the grayscale brightness level (e.g., 128).

Panels 710, 740 FIGS. 7A-7B, respectively, depict output of the filtering operation of Eqn. As may be observed in FIG. 7A, image of panel 710 (corresponding to the out of focus image of panel 700) is substantially void of high frequency content (e.g., the location 712 corresponding to the representation of the flower does not contain readily discernable feature(s)). As may be observed in FIG. 7B, the image of panel 740 (corresponding to the in-focus image of panel 720) comprises a plurality of high frequency features (e.g., the flower representation the location 732 may be readily discerned from the grey background).

In order to obtain a quantitative measure of an object presence in a given image (e.g., 720 in FIG. 7B), the corresponding high-pass filtered image (e.g., 740 in FIG. 7B) may be analyzed. The analysis may comprise for instance determination of deviation of pixel values from the mean intensity value within the image (e.g., 128 in some implementations of 8-bit greyscale images). In some implementations, the analysis may comprise determination of a contrast parameter configured based on a maximum of absolute deviation of a pixel value within the image from the image median value. In some implementations, the contrast parameter may be low-pass filtered using a running mean, an exponential filter, and/or other filter approach configured to reduce frame-to-frame variability. The exemplary filtered contrast parameter data shown by curve 602 in FIG. 6A were obtained using a running mean window of 25 frames in width, although it is appreciated that other values may readily be used consistent with the present disclosure. Temporal filtering may be employed in order to reduce number of false positives generated e.g. by thermal noise on the detector, camera shake, and/or other sources of noise.

The contrast parameter for a given image may be evaluated in light of one or more criteria (e.g., compared to a threshold) in order to determine presence of an object in the associated image. FIG. 6A illustrates contrast parameter values (curve 602) obtained for a plurality of images and the corresponding detection output (curve comprising portions 614, 616, 618. Data shown by curve 602 may correspond to output 510 of the component 522 of the detection the apparatus 500 of FIG. 5A. Data shown by segments 614, 616, 618 may correspond to output 512 of the apparatus 500 of FIG. 5A.

Detection threshold used for determining the presence of an object is shown by broken line 604 in FIG. 6A. In one or more implementations, the threshold value 604 may be selected and/or configured dynamically based on, e.g., ambient light conditions, time of day, and/or other parameters. Values of the curve 602 that fall in the range 608 below the threshold 604 may cause a negative detection signal (e.g., equal to zero as shown by the segments 614, 618 in FIG. 6A). Values of the curve 602 that fall in the range 606 at and/or above the threshold 604 may cause a positive detection signal (e.g., equal to one as shown by segment 616 in FIG. 6A).

Figure 6B:
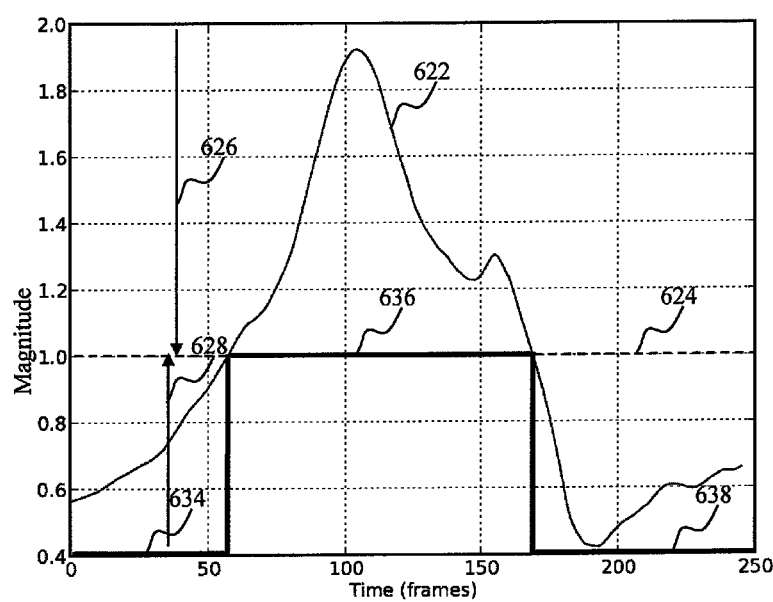
FIG. 6B is a plot illustrating output of an optical signal detection apparatus (e.g., the apparatus 530 of FIG. 5B), according to one or more implementations.

FIGS. 6B and 8A-8B illustrate object detection using of spectral approach to image contrast analysis (by, e.g., the apparatus 530 of FIG. 5B), according to one or more implementations.

The input image (e.g., image 700, 720) may be transformed using a Fourier transformation, e.g., discrete Fourier transform (DFT), cosine Fourier transform, a Fast Fourier transform (FFT) or other spatial scale transformation. FIG. 8A illustrates a power spectrum of the de-focused image shown in panel 700 of FIG. 7A. FIG. 8B illustrates a power spectrum of the in-focus image shown in panel 720 of FIG. 7B.

The image spectra may be partitioned into a low-frequency portion and a high frequency portion. In some implementations, e.g., such as illustrated in FIG. 6B, the spectral partitioning may be configured based on an elliptical or circular curve area around the origin (e.g., zero frequency point). In some implementations, e.g., shown in FIG. 6B, the data were obtained using an ellipse with (x,y) axes selected at (37, 65) units of cycles along corresponding axis. Low frequency energy portion Elo may be obtained by determining a sum of power spectral values within the ellipse area. The high frequency energy portion Ehi may be obtained by determining a sum of power spectral values outside the ellipse area.

Detection of an object in a given image may comprise determination of a contrast parameter for a given image. In some implementations, the contrast parameter may be configured based on a comparison of the high frequency energy portion and the low frequency energy portion. In some implementations, the contrast parameter (C) may be determined based on a ratio or other relationship of the high frequency energy portion and the low frequency energy portion, such as the exemplary relationship of Eqn. 2 below.

$$C = Ehi/Elo \qquad \text{(Eqn. 2)}$$

The contrast parameter for a given image may be compared to a threshold in order to determine presence of an object in the associated image. FIG. 6B presents the contrast parameter (curve 622) for a series of images acquired by an optical object detection device disposed on a moving platform. The thick segments 634, 636, 638 in FIG. 6B depicts the detection output corresponding detection output. Data shown by segments 634, 636, 638 may correspond to output 540 of the component 538 of the detection the apparatus 530 of FIG. 5B.

The detection threshold used for determining the presence of an object is shown by the broken line 624 in FIG. 6B. In one or more implementations, the threshold value 624 may be selected (e.g., equal one in FIG. 6B) and/or configured dynamically based on, e.g., ambient light conditions, time of day, and/or other parameters. Values of the contrast parameter of curve 622 that fall in the range 628 below the threshold 624 may cause a negative detection signal (e.g., equal to zero as shown by the segments 634, 638 in FIG. 6B). Values of the curve 622 that fall in the range 626 at and/or above the threshold 624 may cause a positive detection signal (e.g., equal to one as shown by segment 636 in FIG. 6B).

FIG. 9 illustrates a computerized apparatus for implementing, inter cilia, object detection in accordance with one or more implementations. The apparatus 900 may comprise a processing module 916 configured to receive sensory input from sensory block 920 (e.g., camera 106 in FIG. 1). The processing module 916 may be configured to implement signal processing functionality (e.g., object detection).

The apparatus 900 may comprise memory 914 configured to store executable instructions (e.g., operating system and/or application code, raw and/or processed data such as raw image fames, image spectrum, and/or contrast parameter, information related to one or more detected objects, and/or other information).

In some implementations, the processing module 916 may interface with one or more of the mechanical 918, sensory 920, electrical 922, power components 924, communications interface 926, and/or other components via driver interfaces, software abstraction layers, and/or other interfacing techniques. Thus, additional processing and memory capacity may be used to support these processes. However, it will be appreciated that these components may be fully controlled by the processing module. The memory and processing capacity may aid in processing code management for the apparatus 900 (e.g. loading, replacement, initial startup and/or other operations). Consistent with the present disclosure, the various components of the device may be remotely disposed from one another, and/or aggregated. For example, the instructions operating the detection process may be executed on a server apparatus that may control the mechanical components via a network or a radio connection. In some implementations, multiple mechanical, sensory, electrical units, and/or other components may be controlled by a single robotic controller via network/radio connectivity.

The mechanical components 918 may include virtually any type of device capable of motion and/or performance of a desired function or task. Examples of such devices may include one or more of motors, servos, pumps, hydraulics, pneumatics, stepper motors, rotational plates, micro-electromechanical devices (MEMS), electroactive polymers, shape memory alloy (SMA) activation, and/or other devices. The sensor devices may interface with the processing module, and/or enable physical interaction and/or manipulation of the device.

The sensory component may be configured to provide sensory input to the processing component. In some implementations, the sensory input may comprise camera output images.

The electrical components 922 may include virtually any electrical device for interaction and manipulation of the outside world. Examples of such electrical devices may include one or more of light/radiation generating devices (e.g. LEDs, IR sources, light bulbs, and/or other devices), audio devices, monitors/displays, switches, heaters, coolers, ultrasound transducers, lasers, and/or other electrical devices. These devices may enable a wide array of applications for the apparatus 900 in industrial, hobbyist, building management, medical device, military/intelligence, and/or other fields.

The communications interface may include one or more connections to external computerized devices to allow for, inter cilia, management of the apparatus 900. The connections may include one or more of the wireless or wireline interfaces discussed above, and may include customized or proprietary connections for specific applications. The communications interface may be configured to receive sensory input from an external camera, a user interface (e.g., a headset microphone, a button, a touchpad, and/or other user interface), and/or provide sensory output (e.g., voice commands to a headset, visual feedback, and/or other sensory output).

The power system 924 may be tailored to the needs of the application of the device. For example, for a small hobbyist robot or aid device, a wireless power solution (e.g. battery, solar cell, inductive (contactless) power source, rectification, and/or other wireless power solution) may be appropriate. However, for building management applications, battery backup/direct wall power may be superior, in some implementations. In addition, in some implementations, the power system may be adaptable with respect to the training of the apparatus 900. Thus, the apparatus 900 may improve its efficiency (to include power consumption efficiency) through learned management techniques specifically tailored to the tasks performed by the apparatus 900.

Figure 10:
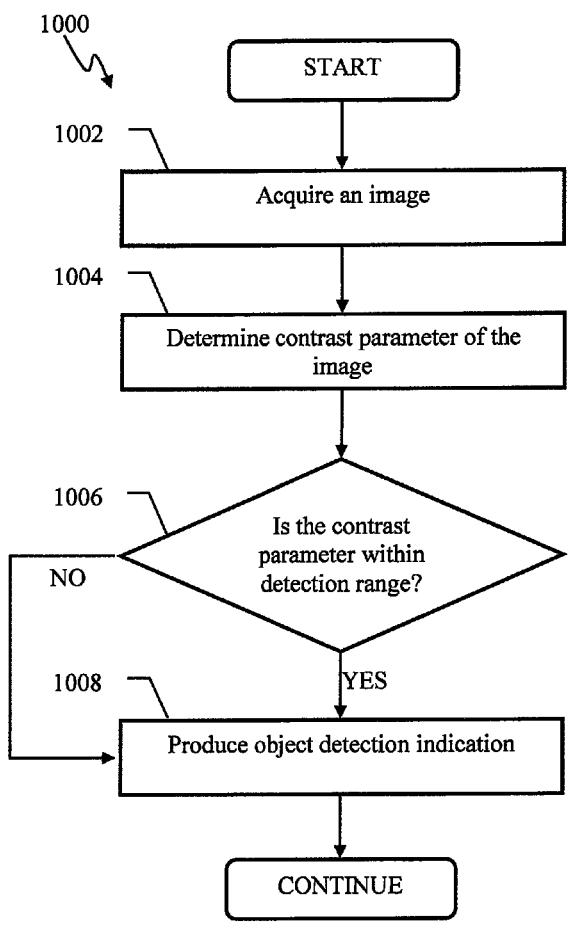
FIG. 10 is a logical flow diagram illustrating a method of determining a salient feature using encoded video motion information, in accordance with one or more implementations.
Figure 11A:
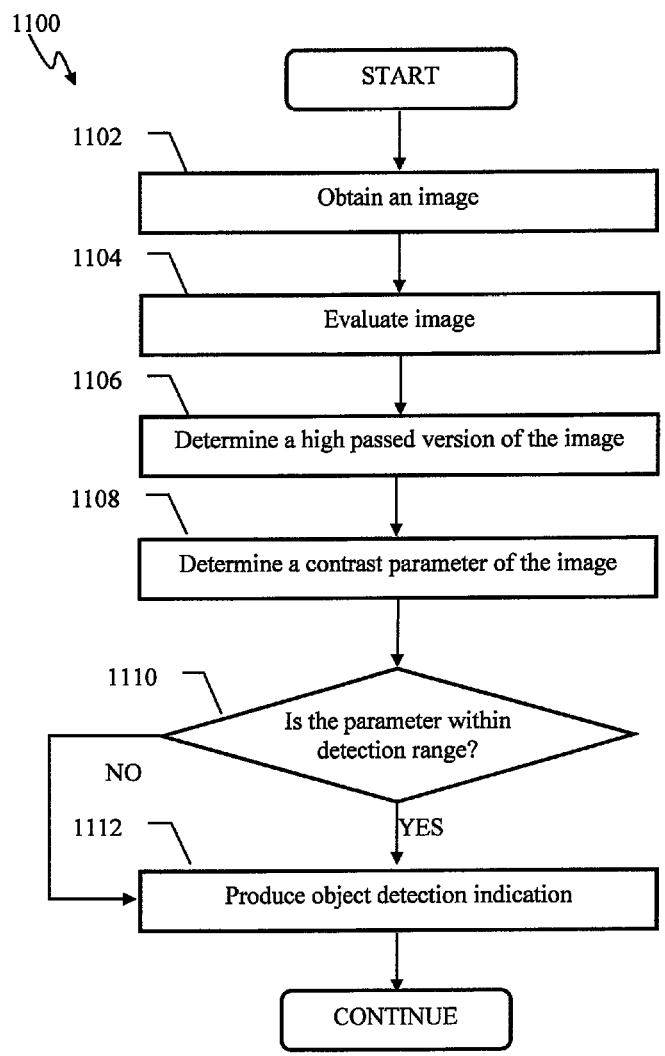
FIG. 11A is a logical flow diagram illustrating a method of image processing useful for object detection by an optical apparatus, in accordance with one or more implementations.
Figure 11B:
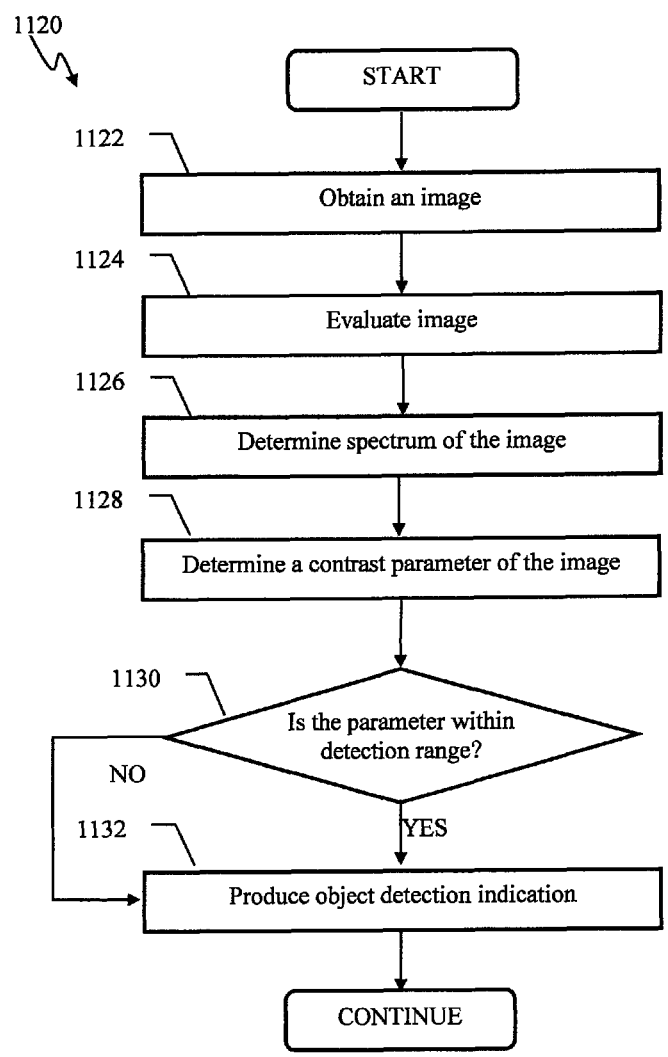
FIG. 11B is a logical flow diagram illustrating a method of image processing useful for object detection by an optical apparatus, in accordance with one or more implementations.
Figure 12:
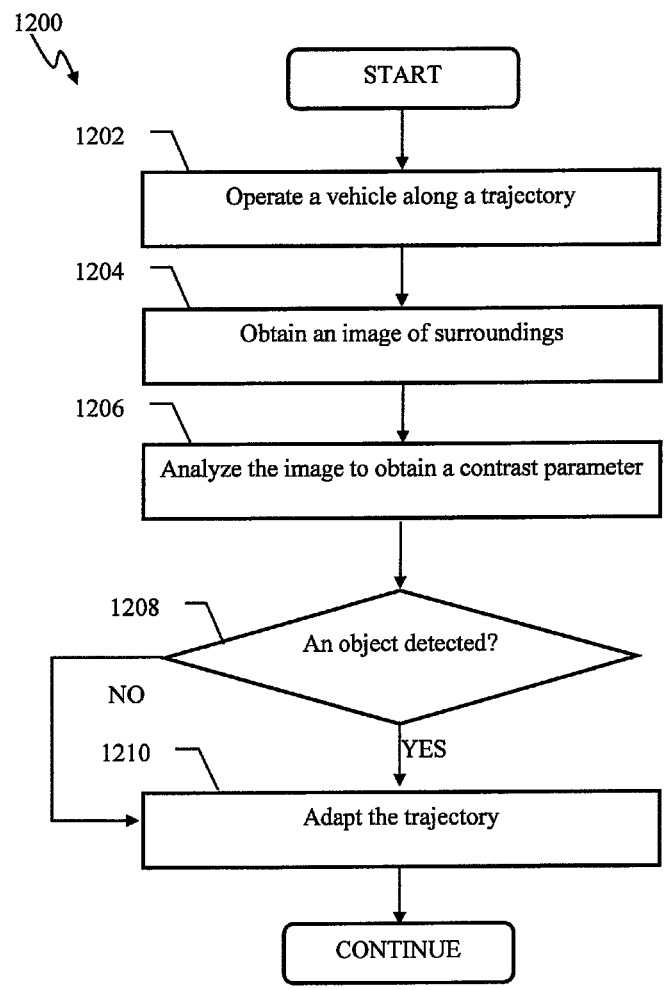
FIG. 12 is a logical flow diagram illustrating a method of executing an action by a robotic vehicle, the action execution configured based on an outcome of object detection methodology of the disclosure, in accordance with one or more implementations.

FIGS. 10-12 illustrate methods 1000, 1100, 1130, 1200 for determining and using object information from images. The operations of methods 1000, 1100, 1130, 1200 presented below are intended to be illustrative. In some implementations, methods 1000, 1100, 1130, 1200 may be accomplished with one or more additional operations not described, and/or without one or more of the operations discussed. Additionally, the order in which the operations of method 1000, 1100, 1130, 1200 are illustrated in FIGS. 10-12 and described below is not intended to be limiting.

In some implementations, methods 1000, 1100, 1130, 1200 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of methods 1000, 1100, 1130, 1200 in response to instructions stored electronically on an electronic storage medium. The one or more processing devices may include one or more devices configured through hardware, firmware, and/or software to be specifically designed for execution of one or more of the operations of methods 1000, 1100, 1200, 1300.

FIG. 10 illustrates a method of determining presence of an object in an image using image contrast information in accordance with one or more implementations.

At operation 1002 of method 1000, one or more input images may be acquired. In one or more implementations, individual images may be provided by an optical apparatus (e.g., 200 of FIG. 2) comprising a lens and an image sensor (e.g., CCD, CMOS device, and/or APS, photodiode arrays, and/or other image sensors). In some implementations, the input images may comprise a pixel stream downloaded from a file, such as a stream of two-dimensional matrices of red green blue RGB values (e.g., refreshed at a 25 Hz or other suitable frame rate), It will be appreciated by those skilled in the art when given this disclosure that the above-referenced image parameters are merely exemplary, and many other image representations (e.g., bitmap, luminance-chrominance YUV, YCbCr, grayscale, and/other image representations) may be applicable to and useful with the various implementations. The images may form real-time (live) video.

At operation 1004, image contrast parameter may be determined. In one or more implementations, the contrast parameter determination may be effectuated by a processing apparatus (e.g., the apparatus described with respect to FIGS. 5A-5B) using an image-domain based approach (e.g., such as described with respect to FIG. 6A), an image spectrum domain based approach (e.g., such as described with respect to FIG. 6B and/or Eqn. 2), and/or other applicable methodologies. In some implementations, (e.g., such as described with respect to FIG. 6A, the contrast parameter for a given image may be obtained using a smoothing operation (e.g., based on a block averaging filter, exponential filter, and/or other operation configured to reduce variability of the contrast parameter from one image to another).

At operation 1006, a determination may be made as to whether the parameter(s) of interest meet the relevant criterion or criteria (e.g., the contrast parameter is within detection range). In some implementations, the determination of operation 1006 may be configured based on a comparison of the contrast parameter to a threshold, e.g., as shown and described with respect to FIGS. 6A-6B. In one or more implementations, the threshold value may be selected (e.g., equal one in FIG. 6B) and/or configured dynamically based on, e.g., ambient light conditions, time of day, and/or other parameters.

Responsive to a determination at operation 1006 that the contrast parameter is within the detection range (e.g., breached the threshold), the method 1000 may proceed to operation 1008 wherein an object detection indication may be produced. In some implementations, the object detection indication may comprise a message, a logic level transition, a pulse, a voltage, a register value and/or other means configured to communicate the detection indication to, e.g., a robotic controller.

FIG. 11A illustrates a method of image analysis useful for object detection by an optical apparatus, in accordance with one or more implementations. The operations of method 1100 may be performed by an optical object detection apparatus (e.g., such as that of FIGS. 2-5A) disposed on, e.g., a mobile robotic device.

At operation 1102, an image may be obtained. In some implementations, the image may comprise a 2-array of pixels characterized by one or more channels (grayscale, RGB, and/or other representations) and/or pixel bit depth.

At operation 1104, the obtained image may be evaluated. In some implementations, the image evaluation may be configured to determine a processing load of an image analysis apparatus (e.g., components of the apparatus 500, 530 of FIGS. 5A-5B, and/or 916 of FIG. 9, described above). The evaluation may comprise re-sampling (e.g., down sampling/up-sampling) the image to a given reference resolution. By way of an illustration, an image analysis component may comprise an ASIC configured to accept images of a given resolution (e.g., 320×180 pixels, 640×360 pixels, and/or other resolution). The operation 1104 may be configured to adapt the input image into a compatible resolution. In some implementations, the image evaluation operation may comprise modification of image bit depths (e.g., from 12 to 8 bits), and/or a channel combination operation e.g., configured to produce a grayscale image from RGB image.

At operation 1106 a high-passed version of the image produced by operation 1104 may be obtained. In one or more implementations, the high-pass filtered image version may be produced using a filter operation configured based on a convolution operation with a Laplacian, a difference of Gaussian operation, a combination thereof, and/or other operations. In some implementations, filter operation may be configured based on a hybrid kernel determined using a convolution of the Gaussian smoothing kernel with the Laplacian kernel. The hybrid kernel may be convolved with the image produced by operation 1104 in order to obtain the high-pass filtered image version. In some implementations of down-sampling and high-pass filtering, the image may be convolved with the processing kernel at a subset of locations in the image corresponding to the subsampling parameters, by applying the kernel on a grid of n pixels, where n is the down-sampling parameter.

At operation 1108, a contrast parameter of the high-pass filtered image may be determined. In one or more implementations, the contrast parameter determination may be effectuated by the processing component 522 of the apparatus 500 described with respect to FIG. 5A using an image-domain based approach. The contrast parameter determination using the image-domain based approach may comprise determination of a maximum absolute deviation of individual pixel values within the filtered image from a reference value. The reference value may comprise a fixed pre-computed value, an image mean, image median, and/or a value determined using statistics of multiple images. In some implementations, the contrast parameter for a plurality of images value may be low-pass filtered using a running mean, an exponential filter, and/or other filter approach configured to reduce inter-image variability of the detection process.

At operation 1110, a determination may be made as to whether the contrast parameter may fall within detection range. In some implementations, the determination of operation 1110 may be configured based on a comparison of the contrast parameter to a threshold, e.g., as shown and described with respect to FIG. 6A. In one or more implementations, the threshold value may be selected (e.g., equal to 12% of the maximum deviation as in FIG. 6A) and/or configured dynamically based on, e.g., ambient light conditions, time of day, and/or other parameters.

Responsive to a determination at operation 1110 that the contrast parameter may be within the detection range (e.g., breached the threshold), the method 1100 may proceed to operation 1112 wherein an object detection indication may be produced. In some implementations, the object detection indication may comprise a message, a logic level transition, a pulse, a voltage, a register value and/or other means configured to communicate the detection indication to, e.g., a robotic controller, an alert indication to a user, and/or to another entity.

FIG. 11B illustrates a method of image analysis useful for object detection by an optical apparatus, in accordance with one or more implementations. Operations of method 1130 may be performed by an optical object detection apparatus (e.g., of FIGS. 2-4D, 5B) disposed on a mobile robotic device.

At operation 1122 an image may be obtained. In some implementations, the image may comprise a 2-array of pixels characterized by one or more channels (grayscale, RGB, and/or other representations) and/or pixel bit depth.

At operation 1124, the image may be evaluated. In some implementations, the image evaluation may be configured to determine a processing load of an image analysis apparatus (e.g., components of the apparatus 530 of FIG. 5B, and/or 916 of FIG. 9, described above). The evaluation may comprise re-sampling (e.g., down sampling/up-sampling) the image to a given reference resolution. By way of an illustration, an image analysis component may comprise an ASIC configured to accept images of a given resolution (e.g., 320×180 pixels, 640×360 pixels, and/or other resolution). The operation 1124 may be configured to adapt the input image into a compatible resolution. In some implementations, the image evaluation operation may comprise modification of image bit depths (e.g., from 12 to 8 bits), and/or a channel combination operation e.g., configured to produce a grayscale image from RGB image.

At operation 1126, a spectrum of the image produced by operation 1124 may be obtained. In one or more implementations, the spectrum may be determined using a discrete Fourier transform, and/or other transformation.

At operation 1128, a contrast parameter of the image may be determined. In one or more implementations, the contrast parameter determination may be effectuated by the processing component 538 of the apparatus 530 described with respect to FIG. 5B using an image spectrum-domain based approach spectral domain based approach (e.g., such as described with respect to FIG. 6B and/or Eqn. 2). The contrast parameter determination using the image spectrum-domain based approach may comprise partitioning of the image spectrum into a low spatial frequency portion and a high spatial frequency portion. In some implementations, the spectrum partitioning may be configured by selecting a first area within e.g., circular, elliptical and/or other shape, around the origin (e.g., zero frequency), and a second area comprising the remaining portion of the spectrum (i.e., outside the ellipse/circle). The contrast image parameter may be determined for instance using a ratio of integral power within the first are to the integral power within the second area. In some implementations of a detection system with sensors elements disposed along multiple dimensions (e.g., as in FIG. 3, FIG. 4A, and/or FIG. 4D, image spectrum analysis may enable determination of objects of one or more orientation. For example, a given detector configuration may be more sensitive to objects of one orientation (e.g., vertical) and less sensitive to objects of another orientation (e.g., horizontal). In some implementations, an asymmetrical Laplacian kernel and/or Gabor type filter may be used to facilitate detection of objects at a target orientation.

At operation 1130, a determination may be made as to whether the contrast parameter may fall within detection range. In some implementations, the determination of operation 1130 may be configured based on a comparison of the contrast parameter to a threshold, e.g., as shown and described with respect to FIG. 6B. In one or more implementations, the threshold value may be selected (e.g., equal one as in FIG. 6B) and/or configured dynamically based on, e.g., ambient light conditions, time of day, and/or other parameters, as previously described herein.

Responsive to a determination at operation 1130 that the contrast parameter is within the detection range (e.g., breached the threshold) the method 1120 may proceed to operation 1132, wherein an object detection indication may be produced. In some implementations, the object detection indication may comprise a message, a logic level transition, a pulse, a wireless transmission, a voltage, a register value and/or other means configured to communicate the detection indication to, e.g., a robotic controller, an alert indication to a user, and/or to another entity.

FIG. 12 illustrates a method of executing an action by a robotic vehicle, the action execution configured based on an outcome of object detection methodology of the disclosure, in accordance with one or more implementations.

At operation 1202, a vehicle (e.g., the vehicle 100 of FIG. 1) may be operated, such as to for example navigate a trajectory. The trajectory navigation may be configured to for instance track and/or acquire video of a subject of interest (e.g., a user) from an aerial vehicle (e.g., a quadcopter), for example as described in U.S. Patent Application Ser. Nos. 62/007,311, entitled "APPARATUS AND METHODS FOR TRACKING USING AERIAL VIDEO", filed on Jun. 3, 2014 the foregoing being incorporated herein by reference in its entirety. In some implementations, the vehicle may comprise a robotic device equipped with a learning controller, e.g., such as described in U.S. patent application Ser. No. 13/842,530, entitled "ADAPTIVE PREDICTOR APPARATUS AND METHODS", filed herewith on Mar. 15, 2013, the foregoing being incorporated herein by reference in its entirety. In some implementations, the trajectory navigation may comprise one or more actions configured to enable landing of the aerial vehicle, e.g., as described in U.S. patent application Ser. No. 14/285,466, entitled "APPARATUS AND METHODS FOR ROBOTIC OPERATION USING VIDEO IMAGERY", filed herewith on May 22, 2014, and/or Ser. No. 14/285,414, entitled "APPARATUS AND METHODS FOR DISTANCE ESTIMATION USING MULTIPLE IMAGE SENSORS", filed on May 22, 2014, each of the foregoing incorporated herein by reference in its entirety.

At operation 1204, an image of the surrounding may be obtained. In one or more implementation, the image may comprise representation of one or more objects in the surroundings (e.g., the objects 112, 122 in FIG. 1).

At operation 1206, the image may be analyzed using to obtain contrast parameter. In one or more implementations, the contrast parameter determination may be configured using an image-domain approach (e.g., described above with respect to FIGS. 5A, 6A, 7A-7B, and/or 11A) or an image spectrum-domain approach (e.g., described above with respect to FIGS. 5B, 6B, 8A-8B, and/or 11B).

At operation 1208, a determination may be made as to whether an object may be present in the image obtained at operation 1204. In some implementations, the object presence may be determined based on a comparison of the contrast parameter to a threshold; e.g., as shown and described with respect to FIGS. 6A-6B. In one or more implementations, the threshold value may be selected (e.g., equal one as in FIG. 6B) and/or configured dynamically based on, e.g., ambient light conditions, time of day, and/or other parameters.

Responsive to a determination at operation 1208 that the object is present, the method 1200 may proceed to operation 1210, wherein the trajectory may be adapted. In some implementations, the object presence may correspond to a target being present in the surroundings and/or an obstacle present in the path of the vehicle. The trajectory adaptation may comprise alteration of vehicle course, speed, and/or other parameter. The trajectory adaptation may be configured based on one or more characteristics of the object (e.g., persistence over multiple frames, distance, location, and/or other parameters). In some implementations of target approach and/or obstacle avoidance by a robotic vehicle, when a target may be detected, the trajectory adaptation may be configured to reduce distance between the target and the vehicle (e.g., during landing, approaching a home base, a trash can, and/or other action). When an obstacle may be detected, the trajectory adaptation may be configured to maintain distance (e.g., stop), increase distance (e.g., go away), alter course (e.g., turn) in order to avoid collision. In some implementations, target/obstacle discrimination may be configured based on object color (e.g., approach red ball avoid all other objects); object reflectivity (approach bright objects), shape, orientation, and or other characteristics. In some implementations, object discrimination may be configured based on input from other sensors (e.g., RFID signal, radio beacon signal, acoustic pinger signal), location of the robotic device (e.g., when the vehicle is in the middle of a room all objects are treated as obstacles), and/or other approaches.

Although the above application of the object detection methodology is described for a vehicle navigation application, it will be appreciated by those skilled in the arts that various other implementations of the methodology of the present disclosure may be utilized. By way of an illustration, a security camera device may be used to observe and detect potential intruders (e.g., based on sudden appearance of objects) and/or detect theft (e.g., based on a sudden disappearance of previously present objects)

Implementations of the principles of the disclosure may be further applicable to a wide assortment of applications including computer-human interaction (e.g., recognition of gestures, voice, posture, face, and/or other interactions), controlling processes (e.g., processes associated with an industrial robot, autonomous and other vehicles, and/or other processes), augmented reality applications, access control (e.g., opening a door based on a gesture, opening an access way based on detection of an authorized person), detecting events (e.g., for visual surveillance or people or animal counting, tracking).

A video processing system of the disclosure may be implemented in a variety of ways such as, for example, a software library, an IP core configured for implementation in a programmable logic device (e.g., FPGA), an ASIC, a remote server, comprising a computer readable apparatus storing computer executable instructions configured to perform feature detection. Myriad other applications exist that will be recognized by those of ordinary skill given the present disclosure.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A method of navigating a trajectory by a robotic apparatus comprising a controller, an actuator and a sensor, the method comprising:

obtaining at least one image associated with surroundings of the apparatus using the sensor, the sensor comprising two or more discrete image detectors, each of the two or more discrete image detectors sharing a common lens and being associated with respective two or more areas of focus, the two or more areas of focus corresponding to two or more respective extents in the surroundings;

analyzing the at least one image to determine a contrast parameter of the at least one image;

detecting a presence of an object in the at least one image based at least in part on the contrast parameter meeting one or more criteria;

during the navigating of the trajectory by the robotic apparatus, determining a distance to the object when the presence of the object produces an in-focus representation within a given extent of the two or more extents in the surroundings; and causing the controller to activate the actuator based on the detection of the presence of the object;

wherein the actuator activation is configured consistent with a characteristic of the object.

2. The method of claim 1, wherein:

the robotic apparatus comprises a vehicle;

the object comprises one of a target or an obstacle; and the actuator activation comprises causing the vehicle to perform at least one of a target approach action or an obstacle avoidance action.

3. The method of claim 2, wherein:
the characteristic of the object comprises a distance of a camera to the object;
for the target approach action, the actuator activation comprises reducing the distance; and
for the obstacle avoidance action, the actuator activation comprises increasing the distance.

4. The method of claim 2, wherein:
the trajectory is characterized by motion direction;
the characteristic of the object comprises a location of the object with respect to the camera;
for the target approach action, the actuator activation comprises adjusting the motion towards the location; and
for the obstacle avoidance action, the actuator activation comprises adjusting the motion away from the location.

5. The method of claim 4, wherein the selective activation comprises an activation of one or more actions by the actuator which comprises causing the apparatus to either increase or decrease proximity of the apparatus to the object.

6. The method of claim 1, further comprising producing the respective two or more areas of focus by disposing the each of the two or more discrete image detectors sharing the common lens at an angle relative to the common lens.

7. The method of claim 1, wherein the causing of the controller to activate the actuator comprises causing the robotic apparatus to execute a physical task relevant to the surroundings.

8. The method of claim 1, wherein the analyzing the at least one image to determine the contrast parameter comprises obtaining a high-pass filtered version of the at least one image.

9. A method of navigating a robotic apparatus comprising a controller, an actuator and a sensor, the method comprising:
obtaining, through a lens, at least one image associated with surroundings of the apparatus using the sensor, the sensor comprising a plurality of image detectors disposed at an angle with respect to a plane of the lens, each of the plurality of image detectors being associated with an extent located in the surroundings;
analyzing the at least one image to detect a presence of one or more objects in the at least one image;
during the navigating of the robotic apparatus, detecting a distance to the one or more objects based on the presence of at least one of the one or more objects within the extent located in the surroundings;
determining that the detected object comprises one of either a target or an obstacle; and
causing the controller to selectively activate the actuator based on the determination.

10. The method of claim 9, further comprising producing one or more areas of focus with the plurality of image detectors via the angle with respect to the plane of the lens.

11. The method of claim 9, further comprising determining a physical feature of at least one of the one or more objects.

12. The method of claim 9, further comprising producing a high-passed version of the at least one image obtained through the lens.

13. The method of claim 12, further comprising determining a contrast parameter of the high-passed version of the at least one image.

14. The method of claim 13, wherein the detection of the one or more objects in the at least one image comprises a determination that the contrast parameter satisfies a threshold.

15. An apparatus configured to cause a robotic device to navigate a trajectory, the apparatus comprising a non-transitory computer-readable medium comprising a plurality of instructions configured to cause the apparatus to, when executed by a processor:
obtain an image associated with surroundings of the apparatus using a sensor of the device, the sensor comprising multiple discrete image sensors located behind a single lens, each of the multiple discrete image sensors being associated with respective extents located in the surroundings of the apparatus;
analyze the image to determine a contrast parameter of the image;
detect a presence of an object in the image based at least in part on the contrast parameter meeting one or more criteria; and
cause a controller of the device to activate an actuator of the device based on the detection of the presence of the object;
wherein the actuator is configured to be activated based on a characteristic of the object; and
wherein during the navigation of the trajectory by the robotic device, the apparatus is configured to determine (i) a first distance to the object when the presence of the object produces a first in-focus representation within a first extent of the respective extents and (ii) a second distance to the object when the presence of the object produces a second in-focus representation within a second extent of the respective extents.

16. The apparatus of claim 15, wherein:
the characteristic of the object comprises the first or the second distance of the device to the object;
the trajectory is configured to be adjusted based on the first or the second distance to the object.

17. The apparatus of claim 15, wherein the plurality of instructions are configured to cause the apparatus to, when executed by the processor, obtain a high-pass filtered version of the image.

18. The apparatus of claim 17, wherein the contrast parameter of the image comprises a contrast parameter of the high-pass filtered version of the image.

19. The apparatus of claim 15, wherein the one or more criteria comprise a threshold or a detection range.

20. The apparatus of claim 19, wherein the plurality of instructions are configured to cause the apparatus to, when executed by the processor:
when the one or more criteria are met, produce an object detection indication; and
communicate the object detection indication to the controller.

* * * * *